US008993376B2

(12) United States Patent
Camacho et al.

(10) Patent No.: US 8,993,376 B2
(45) Date of Patent: **\*Mar. 31, 2015**

(54) SEMICONDUCTOR DEVICE AND METHOD OF FORMING WAFER-LEVEL MULTI-ROW ETCHED LEADFRAME WITH BASE LEADS AND EMBEDDED SEMICONDUCTOR DIE

(75) Inventors: Zigmund R. Camacho, Singapore (SG); Emmanuel A. Espiritu, Singapore (SG); Henry D. Bathan, Singapore (SG); Dioscoro A. Merilo, Singapore (SG)

(73) Assignee: STATS ChipPAC, Ltd., Singapore (SG)

( \* ) Notice: Subject to any disclaimer, the term of this patent is extended or adjusted under 35 U.S.C. 154(b) by 45 days.

This patent is subject to a terminal disclaimer.

(21) Appl. No.: 13/284,811

(22) Filed: Oct. 28, 2011

(65) Prior Publication Data
US 2012/0038064 A1 Feb. 16, 2012

Related U.S. Application Data

(63) Continuation of application No. 12/857,395, filed on Aug. 16, 2010, now Pat. No. 8,076,184.

(51) Int. Cl.
*H01L 21/00* (2006.01)
*H01L 23/00* (2006.01)
(Continued)

(52) U.S. Cl.
CPC ............ *H01L 24/29* (2013.01); *H01L 25/0657* (2013.01); *H01L 25/105* (2013.01); *H01L 25/50* (2013.01); *H01L 23/49548* (2013.01); *H01L 23/49575* (2013.01); *H01L 23/49582* (2013.01);
(Continued)

(58) Field of Classification Search
USPC ....... 257/E21.499, E21.5, E21.502, E21.503, 257/E21.504, E21.505, E21.513; 438/106–108, 111, 118, 123–124, 438/126–127, 455
See application file for complete search history.

(56) References Cited

U.S. PATENT DOCUMENTS 6,495,914 B1 \* 12/2002 Sekine et al. .................. 257/723
7,767,496 B2 \* 8/2010 Shim et al. .................... 438/118
(Continued)

OTHER PUBLICATIONS

Kato, Package-loading semiconductor element and its manufacturing method, Jun. 22, 2006, Machine Translated JP 2006165195 Oct. 8, 2013.\*

*Primary Examiner* — Mohsen Ahmadi
(74) *Attorney, Agent, or Firm* — Robert D. Atkins; Patent Law Group: Atkins and Associates, P.C.

(57) ABSTRACT

A semiconductor device has a base substrate with first and second opposing surfaces. A plurality of cavities and base leads between the cavities is formed in the first surface of the base substrate. The first set of base leads can have a different height or similar height as the second set of base leads. A concave capture pad can be formed over the second set of base leads. Alternatively, a plurality of openings can be formed in the base substrate and the semiconductor die mounted to the openings. A semiconductor die is mounted between a first set of the base leads and over a second set of the base leads. An encapsulant is deposited over the die and base substrate. A portion of the second surface of the base substrate is removed to separate the base leads. An interconnect structure is formed over the encapsulant and base leads.

23 Claims, 19 Drawing Sheets

(51) Int. Cl.
  *H01L 25/065* (2006.01)
  *H01L 25/10* (2006.01)
  *H01L 25/00* (2006.01)
  *H01L 23/495* (2006.01)
  *H01L 21/48* (2006.01)
  *H01L 25/16* (2006.01)

(52) U.S. Cl.
  CPC ............ *H01L 21/4832* (2013.01); *H01L 24/81* (2013.01); *H01L 24/85* (2013.01); *H01L 25/16* (2013.01); *H01L 24/19* (2013.01); *H01L 2924/0132* (2013.01); *H01L 2224/16227* (2013.01); *H01L 2224/16245* (2013.01); *H01L 2224/32014* (2013.01); *H01L 2224/32145* (2013.01); *H01L 2224/48247* (2013.01); *H01L 2224/73265* (2013.01); *H01L 2224/83805* (2013.01); *H01L 2224/85411* (2013.01); *H01L 2224/85424* (2013.01); *H01L 2224/85439* (2013.01); *H01L 2224/85444* (2013.01); *H01L 2224/85447* (2013.01); *H01L 2224/85455* (2013.01); *H01L 2224/92247* (2013.01); *H01L 2225/0651* (2013.01); *H01L 2225/06517* (2013.01); *H01L 2225/1029* (2013.01); *H01L 2225/1035* (2013.01); *H01L 2225/1058* (2013.01); *H01L 2924/00014* (2013.01); *H01L 2924/01014* (2013.01); *H01L 2924/01046* (2013.01); *H01L 2924/01078* (2013.01); *H01L 2924/01079* (2013.01); *H01L 2924/01322* (2013.01); *H01L 2924/014* (2013.01); *H01L 2924/15311* (2013.01); *H01L 2225/06558* (2013.01); *H01L 2924/13091* (2013.01); *H01L 2224/29111* (2013.01); *H01L 24/16* (2013.01); *H01L 24/32* (2013.01); *H01L 24/48* (2013.01); *H01L 24/73* (2013.01); *H01L 24/92* (2013.01); *H01L 2224/0401* (2013.01); *H01L 2224/73253* (2013.01); *H01L 2224/81191* (2013.01); *H01L 2224/81411* (2013.01); *H01L 2224/81424* (2013.01); *H01L 2224/81439* (2013.01); *H01L 2224/81444* (2013.01); *H01L 2224/81447* (2013.01); *H01L 2224/81455* (2013.01); *H01L 2225/1023* (2013.01); *H01L 2924/1432* (2013.01); *H01L 2924/1433* (2013.01); *H01L 2924/14335* (2013.01); *H01L 2924/1434* (2013.01); *H01L 2924/01029* (2013.01); *H01L 2224/2919* (2013.01); *H01L 2225/1052* (2013.01); *H01L 2225/107* (2013.01); *H01L 2924/1579* (2013.01); *H01L 2224/16225* (2013.01); *H01L 2224/73267* (2013.01)
  USPC ........... 438/106; 438/107; 438/108; 438/111; 438/123; 438/125; 257/E21.499; 257/E21.5; 257/E21.502; 257/E21.503; 257/E21.504

(56) References Cited

U.S. PATENT DOCUMENTS

| | | | |
|---|---|---|---|
| 7,790,576 | B2 | 9/2010 | Bathan et al. |
| 7,955,942 | B2 | 6/2011 | Pagaila et al. |
| 7,964,450 | B2 | 6/2011 | Camacho et al. |
| 8,143,097 | B2 * | 3/2012 | Chi et al. ............... 438/107 |
| 2004/0262774 | A1 | 12/2004 | Kang et al. |
| 2005/0077613 | A1 | 4/2005 | McLellan et al. |
| 2006/0087037 | A1 | 4/2006 | Hsu |
| 2006/0131691 | A1 * | 6/2006 | Roozeboom et al. ......... 257/534 |
| 2006/0240592 | A1 | 10/2006 | Chai |
| 2007/0164403 | A1 * | 7/2007 | Huang et al. ............ 257/666 |
| 2009/0140442 | A1 * | 6/2009 | Lin ...................... 257/778 |
| 2009/0278243 | A1 * | 11/2009 | Chuang et al. ............ 257/676 |
| 2011/0039357 | A1 * | 2/2011 | Lin et al. ................. 438/26 |
| 2011/0042798 | A1 | 2/2011 | Pagaila et al. |
| 2011/0045634 | A1 * | 2/2011 | Pagaila ................... 438/107 |
| 2011/0059578 | A1 * | 3/2011 | Lin et al. ................. 438/118 |
| 2011/0291249 | A1 * | 12/2011 | Chi et al. ................. 257/675 |
| 2012/0038034 | A1 * | 2/2012 | Shin et al. ................ 257/676 |

* cited by examiner

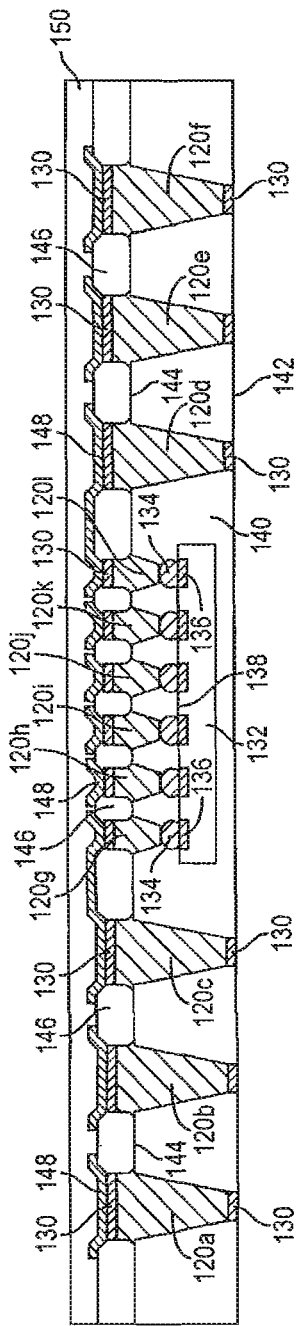
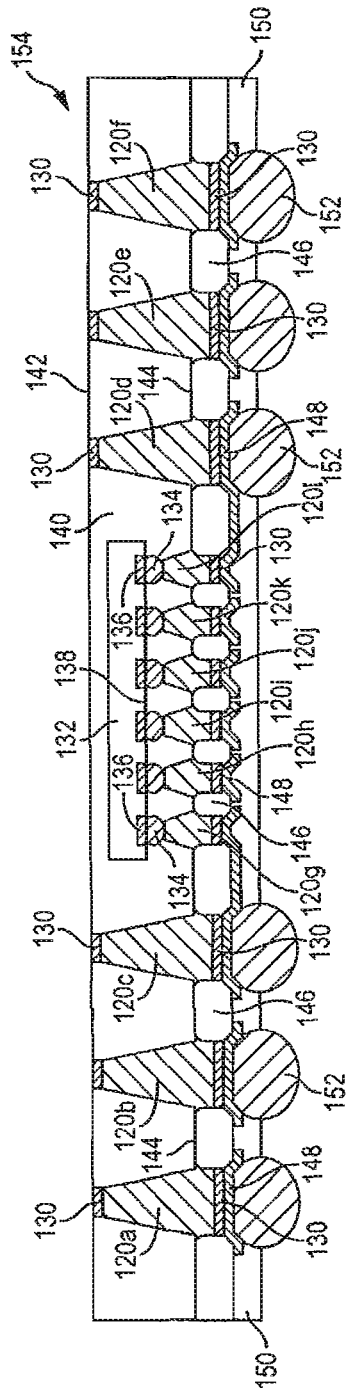

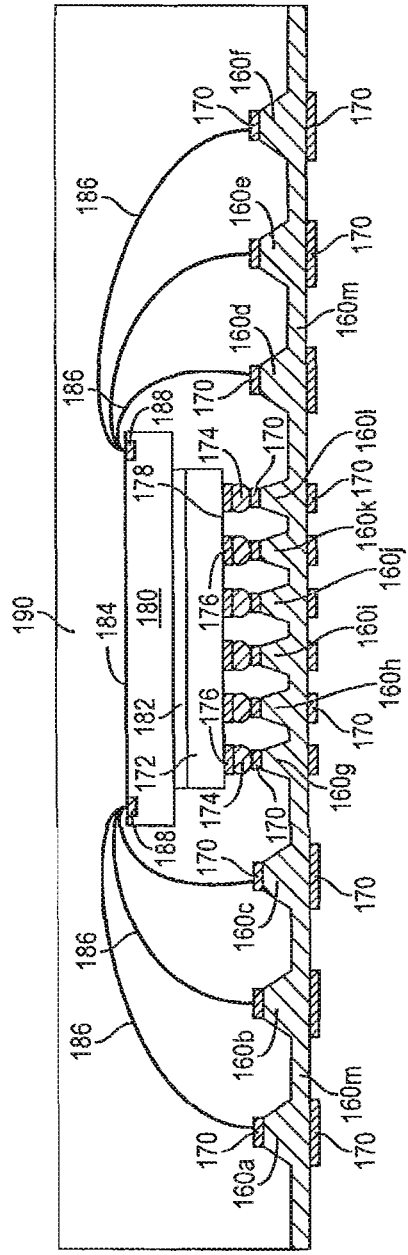
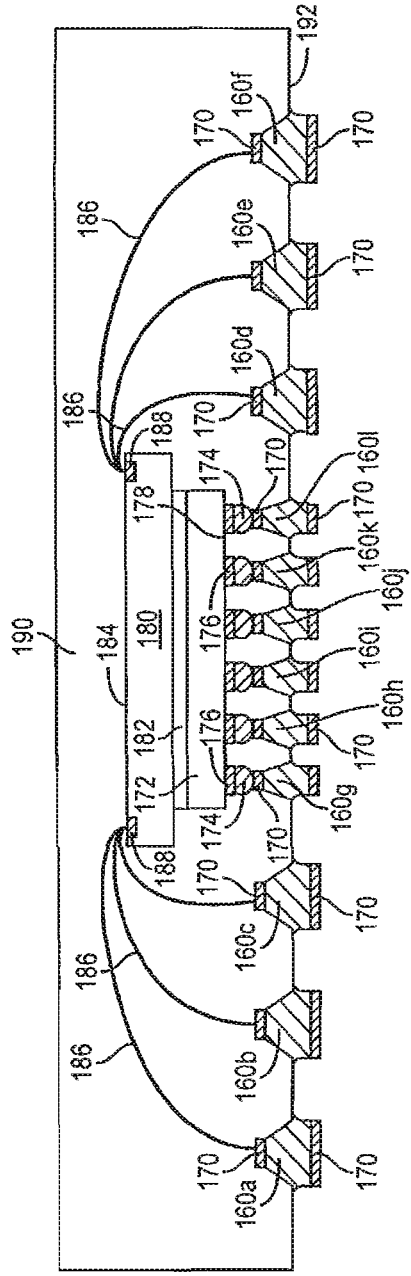
FIG. 5d
FIG. 5e

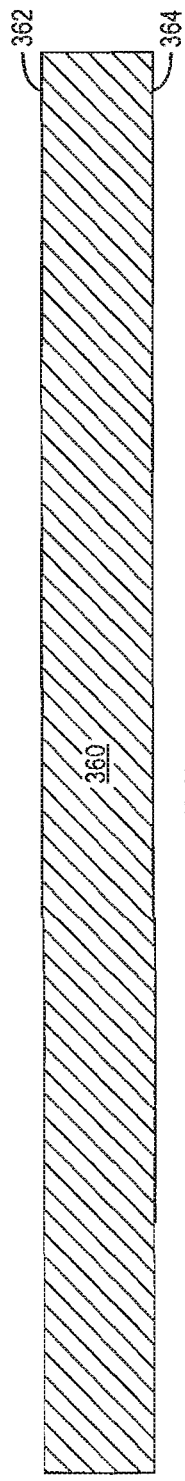
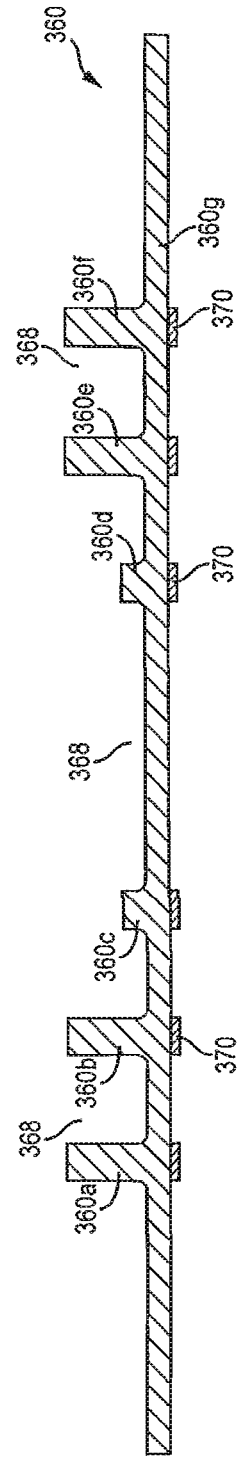
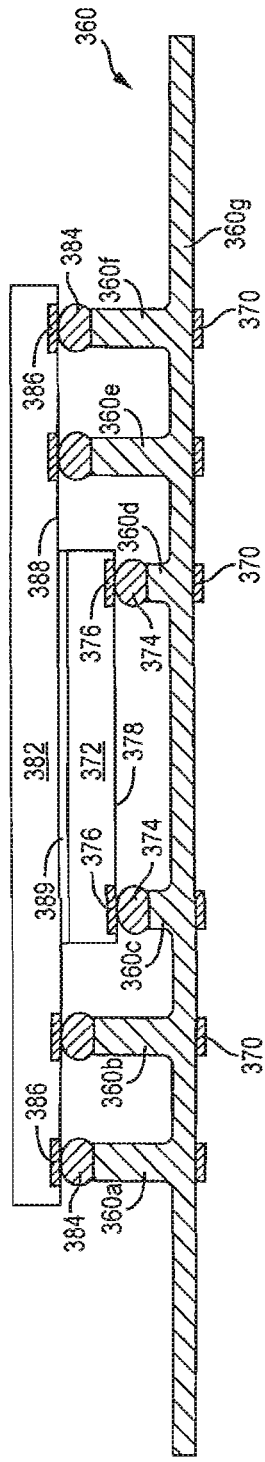
FIG. 11a
FIG. 11b
FIG. 11c

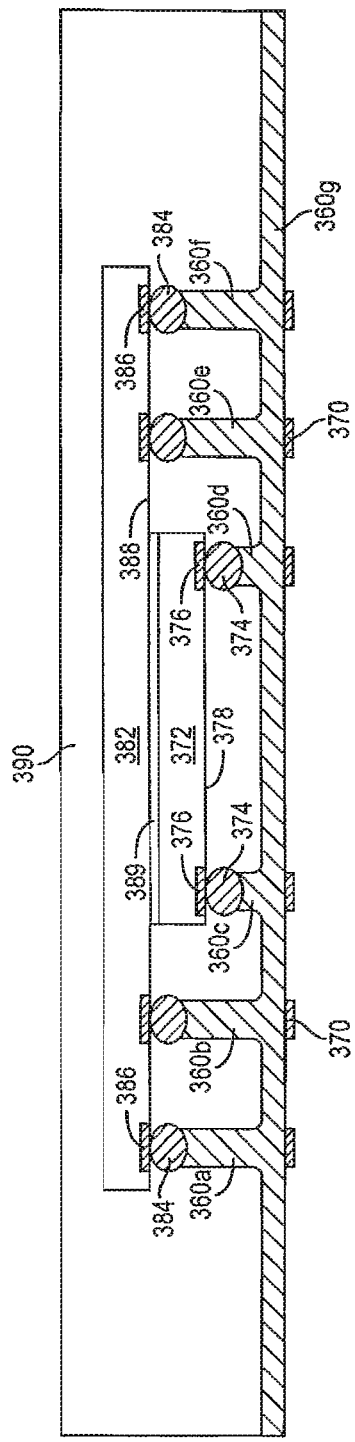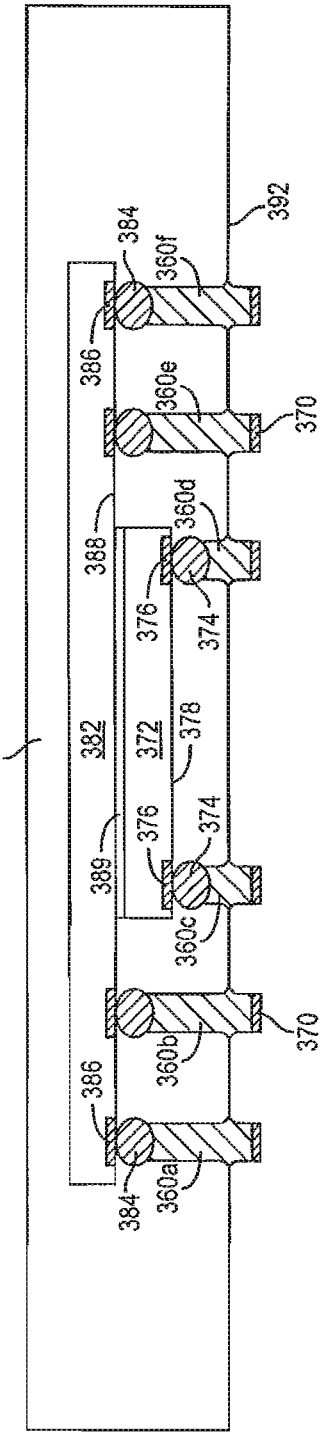

SEMICONDUCTOR DEVICE AND METHOD OF FORMING WAFER-LEVEL MULTI-ROW ETCHED LEADFRAME WITH BASE LEADS AND EMBEDDED SEMICONDUCTOR DIE

CLAIM TO DOMESTIC PRIORITY

The present application is a continuation of U.S. patent application Ser. No. 12/857,395, filed Aug. 16, 2010, now U.S. Pat. No. 8,076,184, and claims priority to the foregoing parent application.

FIELD OF THE INVENTION

The present invention relates in general to semiconductor devices and, more particularly, to a semiconductor device and method of forming a wafer-level multi-row etched leadframe with base leads and embedded semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Semiconductor devices are often stacked for efficient integration. The electrical interconnection between semiconductor devices, such as wafer level chip scale package (WLCSP) containing semiconductor die, on multiple levels (3-D device integration) and external devices can be accomplished with conductive through silicon vias (TSV), through hole vias (THV), Cu-plated conductive pillars, and conductive bumps. These vertical interconnect structures are costly and time consuming during the manufacturing process, and susceptible to defects during formation.

SUMMARY OF THE INVENTION

A need exists to provide simple and cost-effective vertical interconnect structure for stackable semiconductor devices. Accordingly, in one embodiment, the present invention is a method of manufacturing a semiconductor device comprising the steps of providing a base substrate having first and second opposing surfaces, removing a first portion of the base substrate that extends from the first surface partially but not completely through the base substrate to form a plurality of cavities such that a second portion of the base substrate between the cavities forms a first set of base leads and a second set of base leads, mounting a first semiconductor die over the first set of base leads and between the second set of base leads, depositing an encapsulant over the first semiconductor die and base substrate, removing a third portion of the base substrate to separate the first and second set of base leads, and forming an interconnect structure over the encapsulant and electrically connected to first and second sets of base leads.

In another embodiment, the present invention is a method of manufacturing a semiconductor device comprising the steps of providing a base substrate, removing a first portion of the base substrate to form a plurality of cavities and a plurality of base leads between the cavities, mounting a first semiconductor die to the base substrate, depositing a first insulating layer over the first semiconductor die and base substrate, removing a second portion of the base substrate to separate the base leads, and forming an interconnect structure over the first insulating layer and electrically connected to the base leads.

In another embodiment, the present invention is a method of manufacturing a semiconductor device comprising the steps of providing a base substrate having a plurality of base leads, mounting a first semiconductor die to the base substrate, depositing an insulating layer over the first semiconductor die and base substrate, removing a portion of the base substrate to separate the base leads, and forming an interconnect structure over the insulating layer and base leads.

In another embodiment, the present invention is a semiconductor device comprising a base substrate having a plurality of base leads. A first semiconductor die is mounted to the base substrate. An insulating layer is deposited over the first semiconductor die and base substrate, wherein a portion of the base substrate is removed to separate the base leads. An interconnect structure is formed over the insulating layer and base leads.

BRIEF DESCRIPTION OF THE DRAWINGS

FIGS. 3a-3h illustrate a process of forming a wafer-level multi-row etched leadframe with different height base leads and embedded semiconductor die;

FIGS. 5a-5g illustrate a process of forming a wafer-level multi-row etched leadframe with same height base leads and embedded stacked semiconductor die;

FIGS. 11a-11g illustrate a process of forming a wafer-level multi-row etched leadframe with different height base leads and embedded stacked semiconductor die;

DETAILED DESCRIPTION OF THE DRAWINGS

Figure 1:
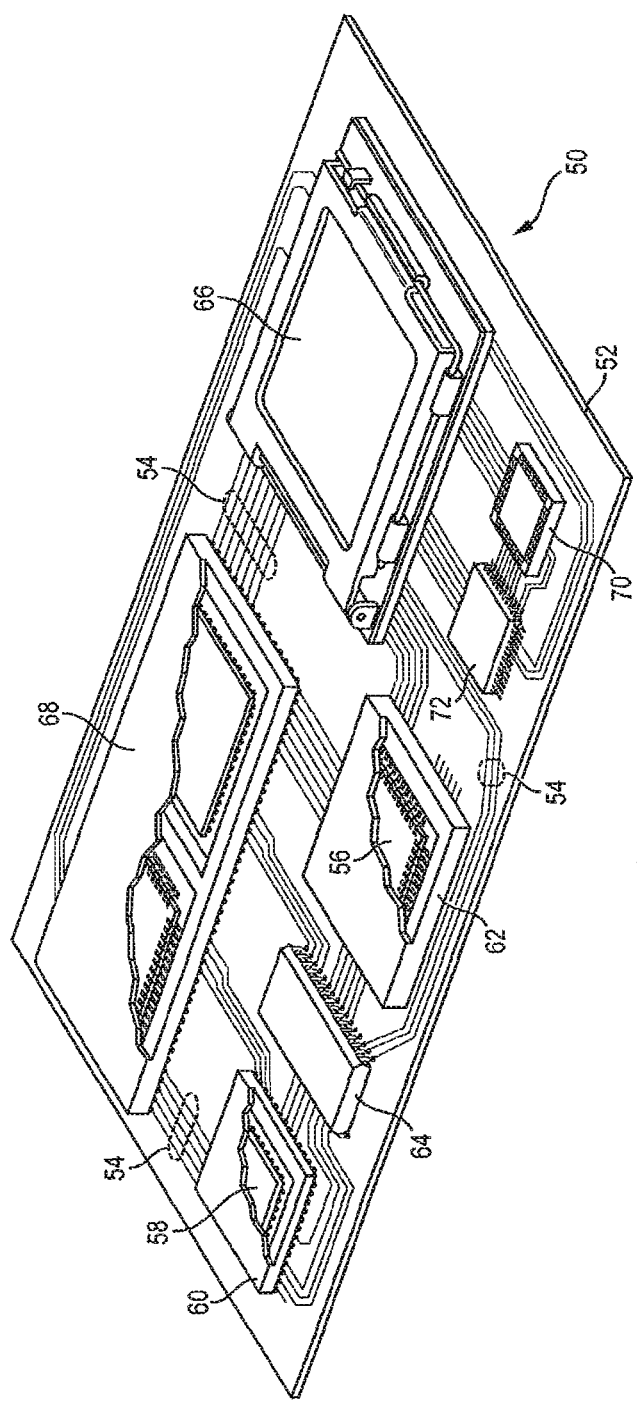
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a sub-component of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
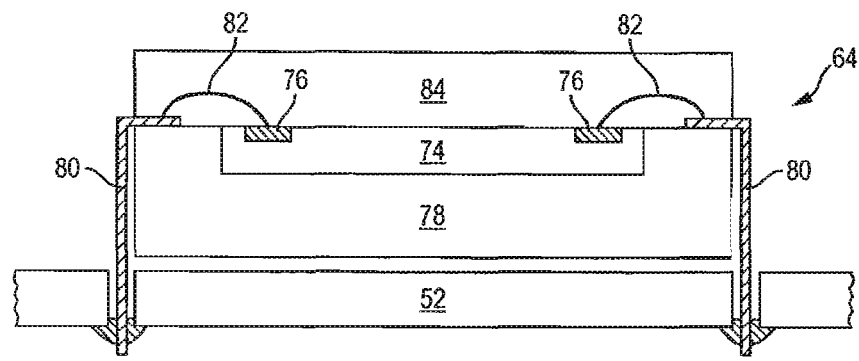
FIGS. 2a-2c illustrate further detail of the semiconductor packages mounted to the PCB.
Figure 2B:
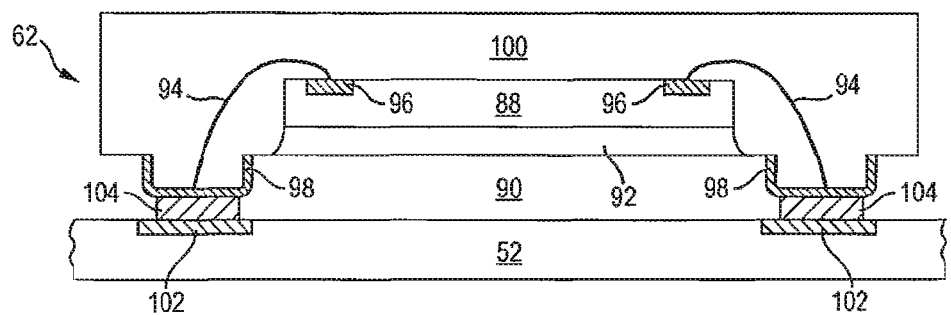
Figure 2C:
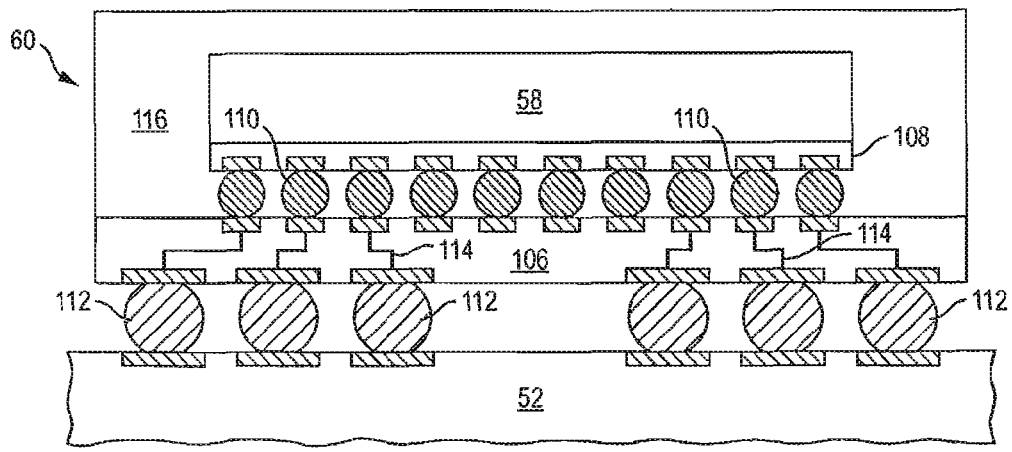

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide vertical electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
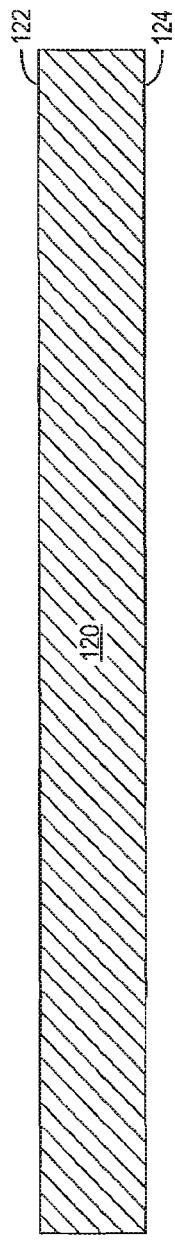

FIGS. 3a-3h illustrate, in relation to FIGS. 1 and 2a-2c, a process of forming a wafer-level multi-row etched leadframe with different height base leads and embedded semiconductor die. FIG. 3a shows a wafer-level base substrate or leadframe 120 made with Cu, Al, or other suitable conductive material. Base substrate 120 has surface 122 and opposite surface 124. Wafer-level base substrate 120 has sufficient area to process multiple semiconductor die, as described below.

Figure 3B:
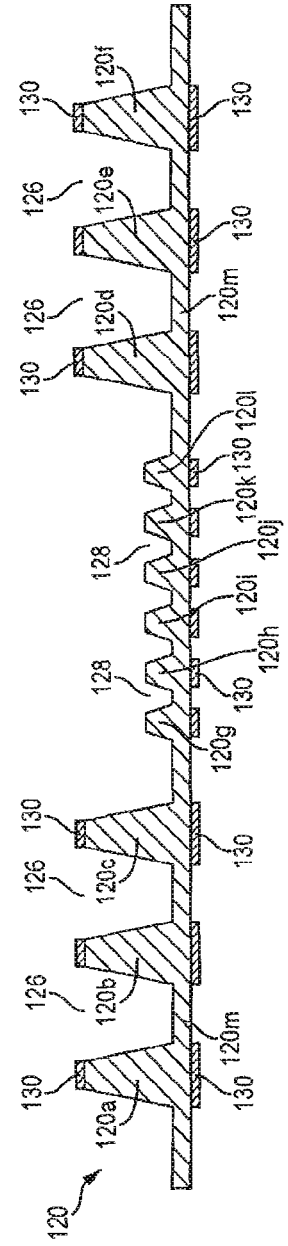

FIG. 3b shows a portion of base substrate 120 associated with one semiconductor die. Base substrate 120 extends beyond the dimensions shown in FIG. 3b for additional semiconductor die. Base substrate 120 is stamped or etched partially through surface 122 to form cavities 126 and 128. The cavities 126 and 128 create multiple rows of base leads or protrusions, including a first set of base leads 120a, 120b, 120c, 120d, 120e, and 120f, and a second set of base leads 120g, 120h, 120i, 120j, 120k, and 120l, extending from the remaining base substrate 120m. Due to the nature and depth of cavities 126 and 128, base leads 120a-120f have greater height than base leads 120g-120l. The remaining base substrate 120m constitutes the bottom of cavities 126 and 128.

An electrically conductive layer 130 is formed over base leads 120a-120f and further over surface 124 of base substrate 120 below base leads 120a-120l using patterning and a suitable metal deposition process such as PVD, CVD, sputtering, electrolytic plating, or electroless plating process. In one embodiment, conductive layer 130 is nickel palladium (NiPd). Alternatively, conductive layer 130 can be one or more layers of Al, Cu, Sn, Ni, Au, Ag, or other suitable electrically conductive material.

Figure 3C:
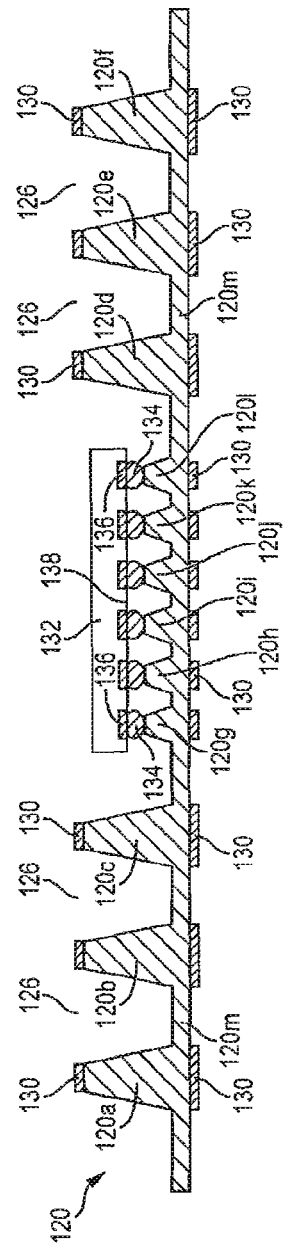

In FIG. 3c, semiconductor die or component 132 is mounted to base lead 120g-120l with bumps 134 formed over contact pads 136 on active surface 138. Semiconductor die 132 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 138 to implement analog circuits or digital circuits, such as digital signal processor (DSP), ASIC, memory, or other signal processing circuit. Semiconductor die 132 may also contain IPDs, such as inductors, capacitors, and resistors, for RF signal processing. In one embodiment, semiconductor die 132 is a flipchip type semiconductor die. In another embodiment, one or more discrete semiconductor components can be mounted to base leads 120g-120l.

Figure 3D:
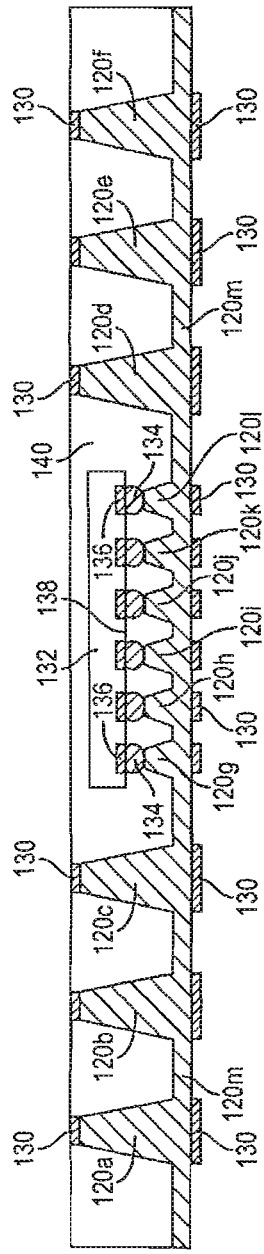

In FIG. 3d, an encapsulant or molding compound 140 is deposited over semiconductor die 132 and base substrate 120, including into cavities 126 and 128 and around base leads 120a-120l, using a paste printing, compressive molding, transfer molding, liquid encapsulant molding, vacuum lamination, spin coating, or other suitable applicator. Encapsulant 140 can be polymer composite material, such as epoxy resin with filler, epoxy acrylate with filler, or polymer with proper filler. Encapsulant 140 is non-conductive and environmentally protects the semiconductor device from external elements and contaminants.

In another embodiment, an insulating or passivation layer is formed over semiconductor die 132 and base substrate 120, including into cavities 126 and 128 and around base lead 120a-120l, by PVD, CVD, printing, spin coating, spray coating, or thermal oxidation. The insulating layer can be one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties.

Figure 3E:
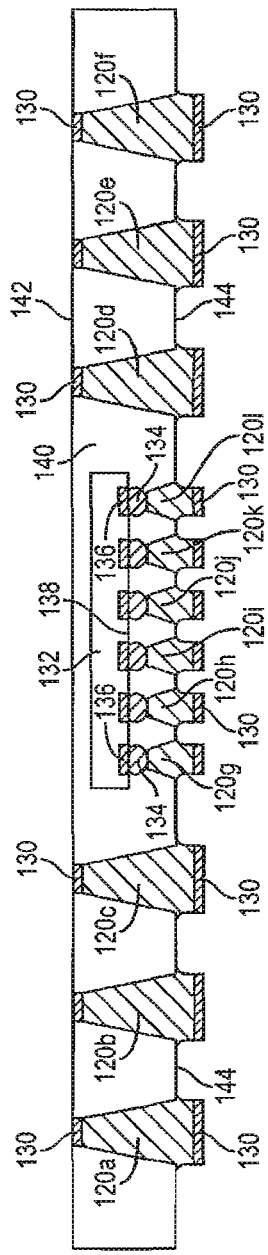

In FIG. 3e, a portion of base substrate 120m and encapsulant 140 is removed by an etching process to separate and electrically isolate base leads 120a-120l into multiple rows defined by the post-etching areas of base substrate 120. Base leads 120a-120l and conductive layer 130 remain intact extending partially or completely through encapsulant 140 following the etching process. Base leads 120a-120f provide vertical electrical connection between surfaces 142 and 144 of encapsulant 140. Base leads 120g-120l provide vertical electrical connection between surface 144 and bumps 134 of semiconductor die 132.

Figure 3F:
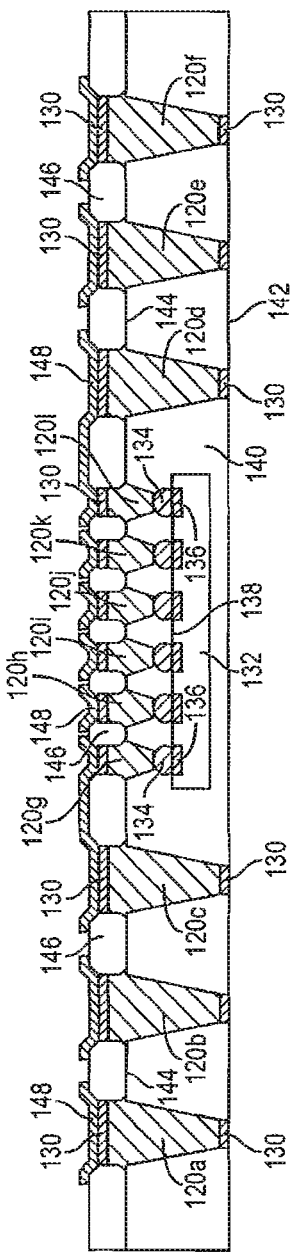

In FIG. 3f, an insulating or passivation layer 146 is formed over encapsulant 140, conductive layer 130, and base leads 120a-120l by PVD, CVD, printing, spin coating, spray coating, or thermal oxidation. The insulating layer 146 can be one or more layers of SiO2, Si3N4, SiON, Ta2O5, Al2O3, or other material having similar insulating and structural properties. A portion of insulating layer 146 is removed by an etching process to expose conductive layer 130.

An electrically conductive layer 148 is formed over conductive layer 130 and insulating layer 146 using patterning and a suitable metal deposition process, such as PVD, CVD, sputtering, electrolytic plating, or electroless plating process. Conductive layer 148 can be one or more layers of Al, Cu, Sn, Ni, Au, Ag, or other suitable electrically conductive material. Conductive layer 148 is electrically connected to conductive layer 130 and base leads 120a-120l and operates as a redistribution layer (RDL) to extend the electrical connectivity for the base leads.

In FIG. 3g, an insulating or passivation layer 150 is formed over insulating layer 146 and conductive layer 148 by PVD, CVD, printing, spin coating, spray coating, or thermal oxidation. The insulating layer 150 can be one or more layers of SiO2, Si3N4, SiON, Ta2O5, Al2O3, or other material having similar insulating and structural properties. A portion of insulating layer 150 can be removed by an etching process to expose conductive layer 148 for additional electrical interconnect.

In FIG. 3h, an electrically conductive bump material is deposited over the exposed conductive layer 148 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 148 using a suitable attachment or bonding process. In one embodiment, the bump material is reflowed by heating the material above its melting point to form spherical balls or bumps 152. In some applications, bumps 152 are reflowed a second time to improve electrical contact to conductive layer 148. The bumps can also be compression bonded to conductive layer 148. Bumps 152 represent one type of interconnect structure that can be formed over conductive layer 148. The interconnect structure can also use bond wires, conductive paste, stud bump, micro bump, or other electrical interconnect.

The wafer-level base substrate 120 is singulated to separate semiconductor die 132 and provide individual embedded wafer-level ball grid array (eWLB), WLCSP, and quad flat pack no-load (QFN) semiconductor packages for further integration. FIG. 3h shows one such semiconductor package 154. Semiconductor die 132 is electrically connected to base leads 120a-120l, conductive layers 130 and 148, and bumps 152. The insulating layers 146 and 150, conductive layer 148, and bumps 152 constitute an interconnect structure formed over encapsulant 140 and base leads 120a-120l. The multiple rows of different height base leads 120a-120l formed from base substrate 120 simplifies and expands the vertical interconnection and integration for stacking semiconductor devices in a cost effective manner.

Figure 4:
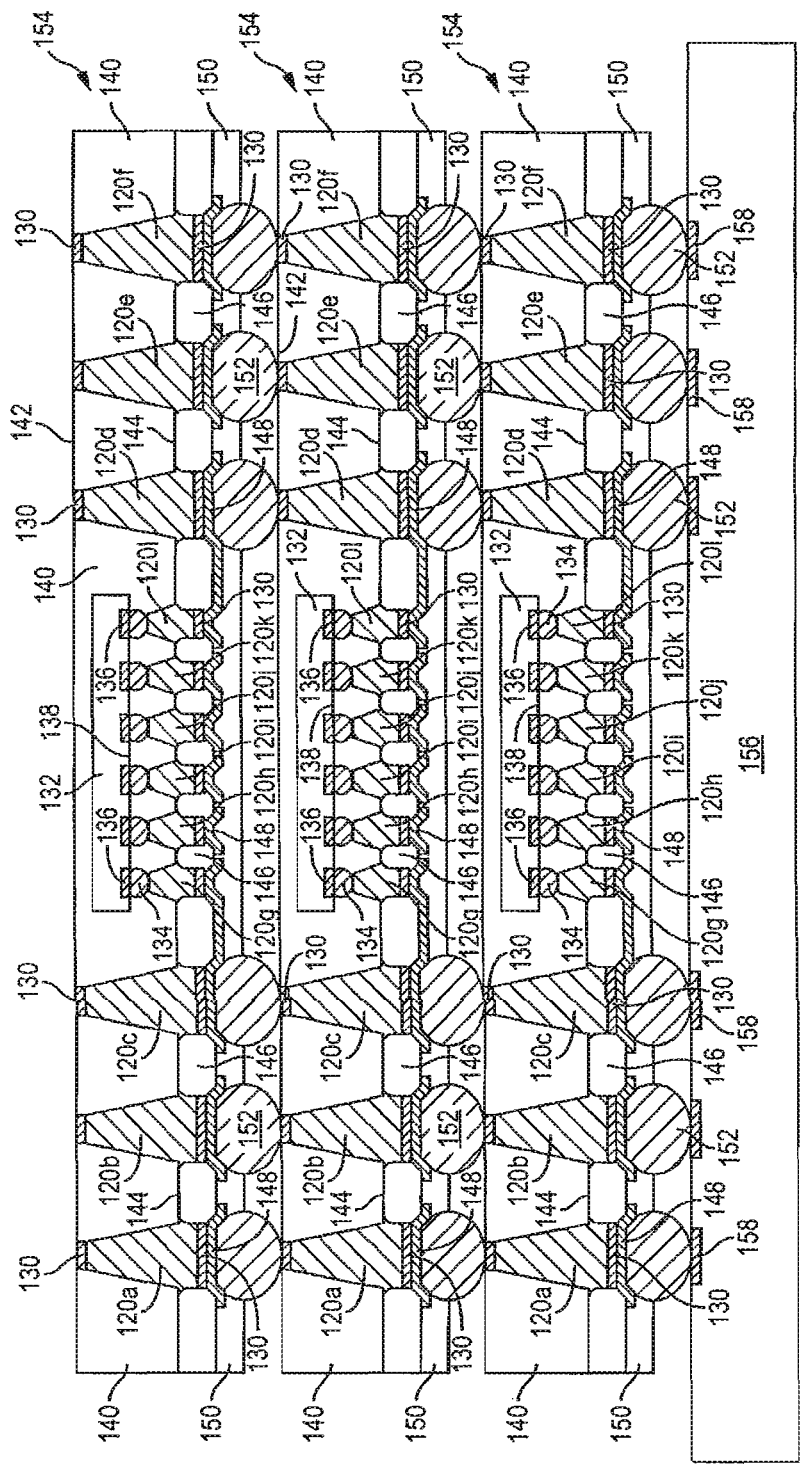
FIG. 4 illustrates stacked semiconductor packages each having etched leadframe with different height base leads and embedded semiconductor die.

FIG. 4 shows a plurality of stacked semiconductor packages 154 electrically connected through base leads 120a-120f and bumps 152. The stacked semiconductor packages 154 are mounted to contact pads 158 on substrate or PCB 156 with bumps 152.

Figure 5A:
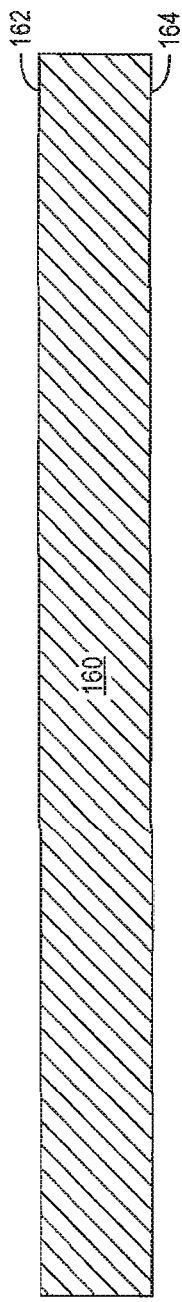

FIGS. 5a-5g illustrate, in relation to FIGS. 1 and 2a-2c, another process of forming a wafer-level multi-row etched leadframe with similar height base leads and embedded semiconductor die. FIG. 5a shows a wafer-level base substrate or leadframe 160 made with Cu, Al, or other suitable conductive material. Base substrate 160 has surface 162 and opposite surface 164. Wafer-level base substrate 160 has sufficient area to process multiple semiconductor die, as described below.

Figure 5B:
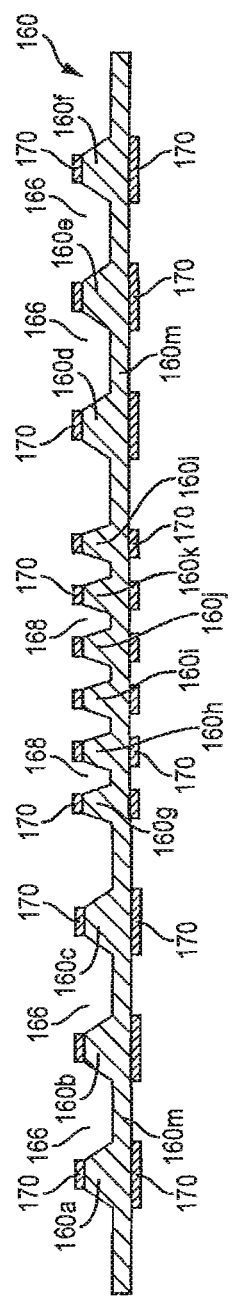

FIG. 5b shows a portion of base substrate 160 associated with one semiconductor die. Base substrate 160 extends beyond the dimensions shown in FIG. 5b for additional semiconductor die. Base substrate 160 is stamped or etched partially through surface 162 to form cavities 166 and 168. The cavities 166 and 168 create multiple rows of base leads or protrusions, including a first set of base leads 160a, 160b, 160c, 160d, 160e, and 160f, and a second set of base leads 160g, 160h, 160i, 160j, 160k, and 160l, extending from the remaining base substrate 160m. Due to the nature and depth of cavities 166 and 168, base leads 160a-160f have substantially the same height as base leads 160g-160l. The remaining base substrate 160m constitutes the bottom of cavities 166 and 168.

An electrically conductive layer 170 is formed over base leads 160a-160f and further over surface 164 of base substrate 160 below base leads 160a-160l using patterning and a suitable metal deposition process such as PVD, CVD, sputtering, electrolytic plating, or electroless plating process. In one embodiment, conductive layer 170 is NiPd. Alternatively, conductive layer 170 can be one or more layers of Al, Cu, Sn, Ni, Au, Ag, or other suitable electrically conductive material.

Figure 5C:
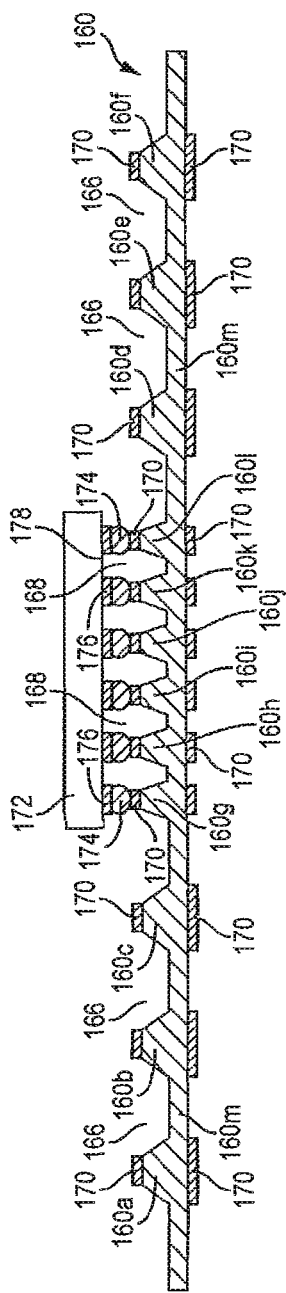

In FIG. 5c, semiconductor die or component 172 is mounted to base lead 160g-160l with bumps 174 formed over contact pads 176 on active surface 178. Semiconductor die 172 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 178 to implement analog circuits or digital circuits, such as DSP, ASIC, memory, or other signal processing circuit. Semiconductor die 172 may also contain IPDs, such as inductors, capacitors, and resistors, for RF signal processing. In one embodiment, semiconductor die 172 is a flipchip type semiconductor die. In another embodiment, one or more discrete semiconductor components can be mounted to base leads 160g-160l.

In FIG. 5d, a semiconductor die or component 180 is mounted to a back surface of semiconductor die 172 with die attach adhesive 182. Semiconductor die 180 has an active surface 184 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 184 to implement analog circuits or digital circuits, such as DSP, ASIC, memory, or other signal processing circuit. Semiconductor die 180 may also contain IPDs, such as inductors, capacitors, and resistors, for RF signal processing. A plurality of bond wires 186 is electrically connected between contact pads 188 formed on active surface 184 and conductive layer 170 over base leads 160a-160f.

An encapsulant or molding compound 190 is deposited over semiconductor die 172 and 180, bond wires 186, and base substrate 160, including into cavities 166 and 168 and around base leads 160a-160l, using a paste printing, compressive molding, transfer molding, liquid encapsulant molding, vacuum lamination, spin coating, or other suitable applicator. Encapsulant 190 can be polymer composite material, such as epoxy resin with filler, epoxy acrylate with filler, or polymer with proper filler. Encapsulant 190 is non-conductive and environmentally protects the semiconductor device from external elements and contaminants.

In another embodiment, an insulating or passivation layer is formed over semiconductor die 172 and 180 and base substrate 160, including into cavities 166 and 168 and around base lead 160a-160l, by PVD, CVD, printing, spin coating, spray coating, or thermal oxidation. The insulating layer can be one or more layers of SiO2, Si3N4, SiON, Ta2O5, Al2O3, or other material having similar insulating and structural properties.

In FIG. 5e, a portion of base substrate 160m and encapsulant 190 is removed by an etching process to separate and electrically isolate base leads 160a-160l into multiple rows defined by the post-etching areas of base substrate 160. Base leads 160a-160l and conductive layer 170 remain intact extending partially into surface 192 of encapsulant 190 following the etching process. Base leads 160a-160f provide vertical electrical connection through bond wires 186 to semiconductor die 180. Base leads 160g-160l provide vertical electrical connection through bumps 174 to semiconductor die 172.

Figure 5F:
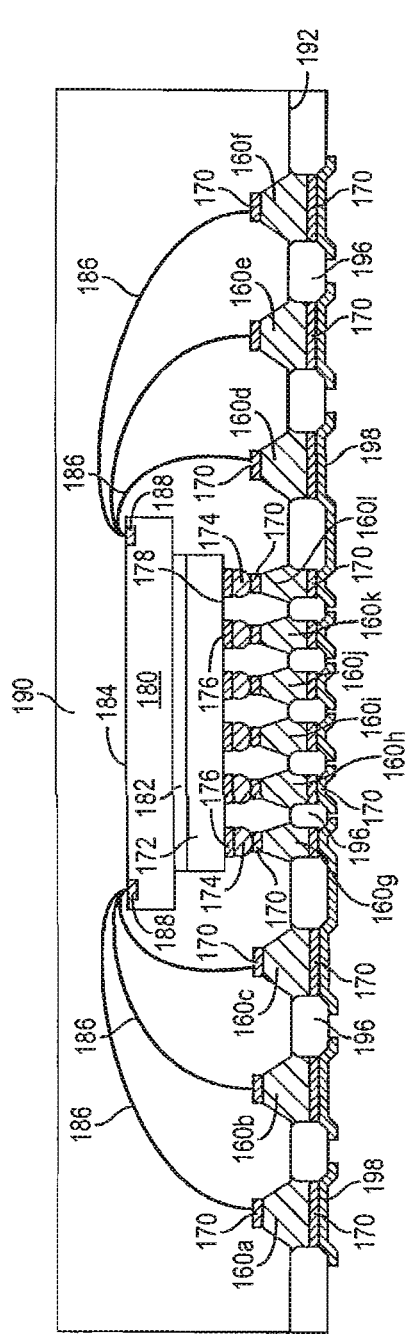

In FIG. 5f, an insulating or passivation layer 196 is formed over encapsulant 190, conductive layer 170, and base leads 160a-160l by PVD, CVD, printing, spin coating, spray coating, or thermal oxidation. The insulating layer 196 can be one or more layers of SiO2, Si3N4, SiON, Ta2O5, Al2O3, or other material having similar insulating and structural properties. A portion of insulating layer 196 is removed by an etching process to expose conductive layer 170.

An electrically conductive layer 198 is formed over conductive layer 170 and insulating layer 196 using patterning and a suitable metal deposition process, such as PVD, CVD, sputtering, electrolytic plating, or electroless plating process. Conductive layer 198 can be one or more layers of Al, Cu, Sn, Ni, Au, Ag, or other suitable electrically conductive material. Conductive layer 198 is electrically connected to conductive layer 170 and base leads 160a-160l and operates as a RDL to extend the electrical connectivity for the base leads.

Figure 5G:
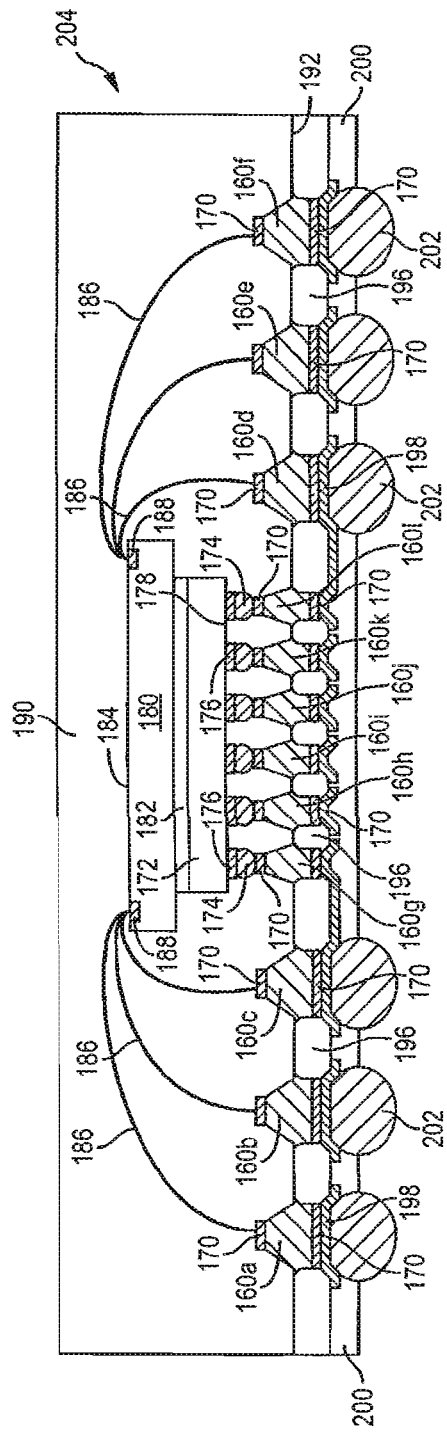

In FIG. 5g, an insulating or passivation layer 200 is formed over insulating layer 196 and conductive layer 198 by PVD, CVD, printing, spin coating, spray coating, or thermal oxidation. The insulating layer 200 can be one or more layers of SiO2, Si3N4, SiON, Ta2O5, Al2O3, or other material having similar insulating and structural properties. A portion of insulating layer 200 is removed by an etching process to expose conductive layer 198.

An electrically conductive bump material is deposited over the exposed conductive layer 198 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 198 using a suitable attachment or bonding process. In one embodiment, the bump material is reflowed by heating the material above its melting point to form spherical balls or bumps 202. In some applications, bumps 202 are reflowed a second time to improve electrical contact to conductive layer 198. The bumps can also be compression bonded to conductive layer 198. Bumps 202 represent one type of interconnect structure that can be formed over conductive layer 198. The interconnect structure can also use bond wires, conductive paste, stud bump, micro bump, or other electrical interconnect.

The wafer-level base substrate 160 is singulated to separate semiconductor die 172 and 180 and provide individual eWLB, WLCSP, and QFN semiconductor packages for further integration. FIG. 5g shows one such semiconductor package 204. Semiconductor die 172 and 180 are electrically connected to base leads 160a-160l, conductive layers 170 and 198, bond wires 186, and bumps 202. The insulating layers 196 and 200, conductive layer 198, and bumps 202 constitute an interconnect structure formed over encapsulant 190 and base leads 160a-160l. The multiple rows of different height base leads 160a-160l formed from base substrate 160 simplifies and expands the vertical interconnection and integration for stacking semiconductor devices in a cost effective manner.

Figure 6:
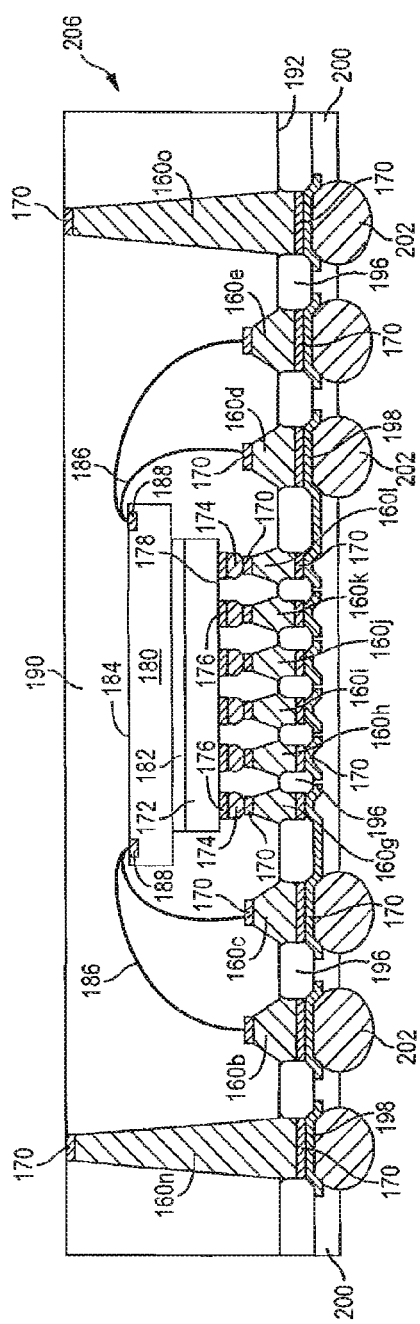
FIG. 6 illustrates the semiconductor package of FIGS. 5a-5g with additional different height base leads.

FIG. 6 shows an embodiment of semiconductor package 206, similar to FIG. 5g, with additional base leads 160n and 160o formed from base substrate 160 and extending through encapsulant 190. Conductive layer 170 is also formed over base leads 160n-160o. Base leads 160n-160o are electrically connected to conductive layer 198 and bumps 202. Base leads 160n-160o have a greater height than base leads 160a-160l and provide vertical electrical connection between opposing surfaces of encapsulant 190.

Figure 7A:
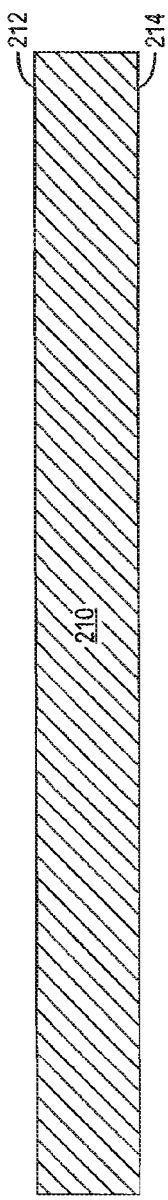
FIGS. 7a-7d illustrate the wafer-level multi-row etched leadframe with concave capture pads formed in the base leads designated for the embedded semiconductor die.

FIGS. 7a-7d illustrate the wafer-level multi-row etched leadframe with concave capture pads formed in the base leads designated for the embedded semiconductor die. FIG. 7a shows a wafer-level base substrate or leadframe 210 made with Cu, Al, or other suitable conductive material. Base substrate 210 has surface 212 and opposite surface 214. Wafer-level base substrate 210 has sufficient area to process multiple semiconductor die, as described below.

Figure 7B:
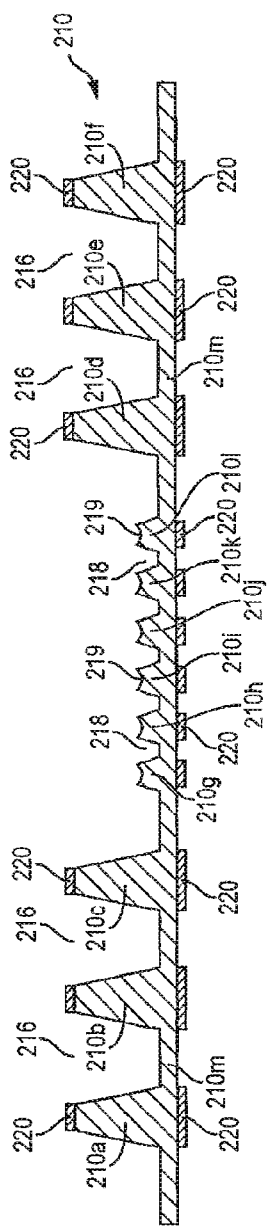

FIG. 7b shows a portion of base substrate 210 associated with one semiconductor die. Base substrate 210 extends beyond the dimensions shown in FIG. 7b for additional semiconductor die. Base substrate 210 is stamped or etched partially through surface 212 to form cavities 216 and 218. The cavities 216 and 218 create multiple rows of base leads or protrusions, including a first set of base leads 210a, 210b, 210c, 210d, 210e, and 210f, and a second set of base leads 210g, 210h, 210i, 210j, 210k, and 210l, extending from the remaining base substrate 210m. In particular, the etching process also forms a concave capture pad 219 in base leads 210g-210l. Due to the nature and depth of cavities 216 and 218, base leads 210a-210f have greater height than base leads 210g-210l.

An electrically conductive layer 220 is formed over base leads 210a-210f and further over surface 214 of base substrate 210 below base leads 210a-210l using patterning and a suitable metal deposition process such as PVD, CVD, sputtering, electrolytic plating, or electroless plating process. In one embodiment, conductive layer 220 is NiPd. Alternatively, conductive layer 220 can be one or more layers of Al, Cu, Sn, Ni, Au, Ag, or other suitable electrically conductive material.

Figure 7C:
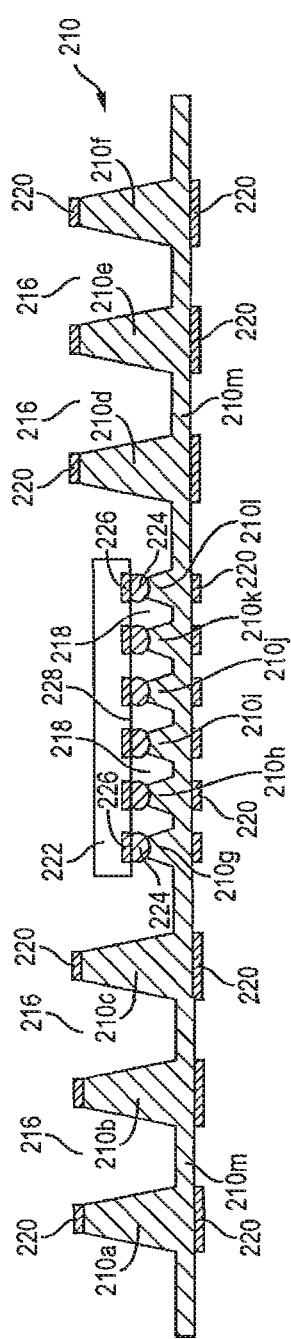

In FIG. 7c, semiconductor die or component 222 is mounted to base lead 210g-210l with bumps 224 formed over contact pads 226 on active surface 228. Bumps 224 are disposed in concave capture pads 219 for accuracy of alignment of semiconductor die 222. Semiconductor die 222 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 228 to implement analog circuits or digital circuits, such as DSP, ASIC, memory, or other signal processing circuit. Semiconductor die 222 may also contain IPDs, such as inductors, capacitors, and resistors, for RF signal processing. In one embodiment, semiconductor die 222 is a flipchip type semiconductor die. In another embodiment, one or more discrete semiconductor components can be mounted to base leads 210g-210l.

Figure 7D:
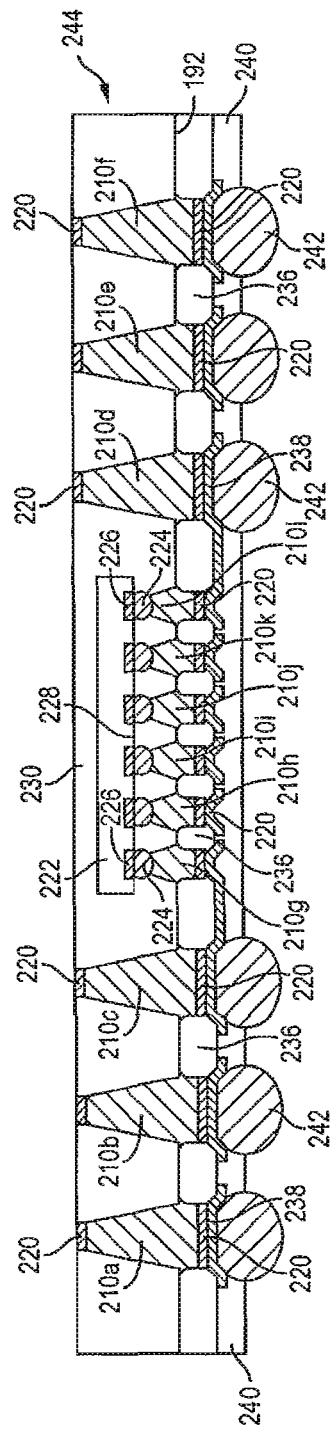

In FIG. 7d, an encapsulant or molding compound 230 is deposited over semiconductor die 222 and base substrate 210, including into cavities 216 and 218 and around base leads 210a-210l, using a paste printing, compressive molding, transfer molding, liquid encapsulant molding, vacuum lamination, spin coating, or other suitable applicator. Encapsulant 230 can be polymer composite material, such as epoxy resin with filler, epoxy acrylate with filler, or polymer with proper filler. Encapsulant 230 is non-conductive and environmentally protects the semiconductor device from external elements and contaminants.

In another embodiment, an insulating or passivation layer is formed over semiconductor die 222 and base substrate 210, including into cavities 216 and 218 and around base lead 210a-210l, by PVD, CVD, printing, spin coating, spray coating, or thermal oxidation. The insulating layer can be one or more layers of SiO2, Si3N4, SiON, Ta2O5, Al2O3, or other material having similar insulating and structural properties.

Similar to FIG. 3e, a portion of base substrate 210m and encapsulant 230 is removed by an etching process to separate and electrically isolate base leads 210a-210l into multiple rows defined by the post-etching areas of base substrate 210. Base leads 210a-210l and conductive layer 220 remain intact extending partially or completely through encapsulant 230 following the etching process. Base leads 210a-210f provide vertical electrical connection through encapsulant 230. Base leads 210g-210l provide vertical electrical connection to bumps 224 of semiconductor die 222.

Similar to FIG. 3f, an insulating or passivation layer 236 is formed over encapsulant 230, conductive layer 220, and base leads 210a-210l by PVD, CVD, printing, spin coating, spray coating, or thermal oxidation. The insulating layer 236 can be one or more layers of SiO2, Si3N4, SiON, Ta2O5, Al2O3, or other material having similar insulating and structural properties. A portion of insulating layer 236 is removed by an etching process to expose conductive layer 220.

An electrically conductive layer 238 is formed over conductive layer 220 and insulating layer 236 using patterning and a suitable metal deposition process, such as PVD, CVD, sputtering, electrolytic plating, or electroless plating process. Conductive layer 238 can be one or more layers of Al, Cu, Sn, Ni, Au, Ag, or other suitable electrically conductive material. Conductive layer 238 is electrically connected to conductive layer 220 and base leads 210a-210l and operates as a RDL to extend the electrical connectivity for the base leads.

Similar to FIG. 3g, an insulating or passivation layer 240 is formed over insulating layer 236 and conductive layer 238 by PVD, CVD, printing, spin coating, spray coating, or thermal oxidation. The insulating layer 240 can be one or more layers of SiO2, Si3N4, SiON, Ta2O5, Al2O3, or other material having similar insulating and structural properties. A portion of insulating layer 240 is removed by an etching process to expose conductive layer 238.

An electrically conductive bump material is deposited over the exposed conductive layer 238 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 238 using a suitable attachment or bonding process. In one embodiment, the bump material is reflowed by heating the material above its melting point to form spherical balls or bumps 242. In some applications, bumps 242 are reflowed a second time to improve electrical contact to conductive layer 238. The bumps can also be compression bonded to conductive layer 238. Bumps 242 represent one type of interconnect structure that can be formed over conductive layer 238. The interconnect structure can also use bond wires, conductive paste, stud bump, micro bump, or other electrical interconnect.

The wafer-level base substrate 210 is singulated to separate semiconductor die 222 and provide individual eWLB, WLCSP, and QFN semiconductor packages for further integration. FIG. 7d shows one such semiconductor package 244. Semiconductor die 222 is electrically connected to base leads 210a-210l, conductive layers 220 and 238, and bumps 242. The insulating layers 236 and 240, conductive layer 238, and bumps 242 constitute an interconnect structure formed over encapsulant 230 and base leads 210a-210l. The multiple rows of different height base leads 210a-210l formed from base substrate 210 simplifies and expands the vertical interconnection and integration for stacking semiconductor devices in a cost effective manner.

Figure 8A:
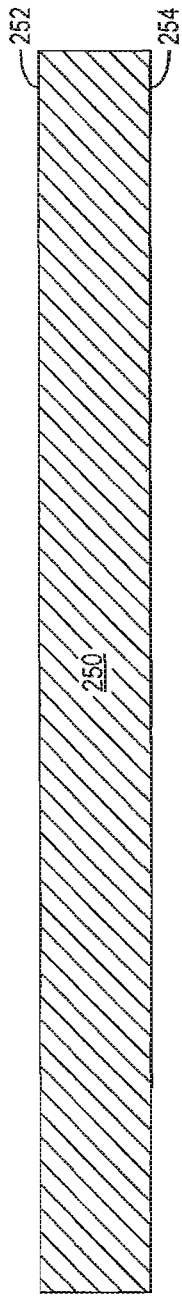
FIGS. 8a-8d illustrate the wafer-level multi-row etched leadframe with concave capture pads formed in the base substrate designated for the embedded semiconductor die.

FIGS. 8a-8d illustrate the wafer-level multi-row etched leadframe with concave crater capture pads formed in the base substrate designated for the embedded semiconductor die. FIG. 8a shows a wafer-level base substrate or leadframe 250 made with Cu, Al, or other suitable conductive material. Base substrate 250 has surface 252 and opposite surface 254. Wafer-level base substrate 250 has sufficient area to process multiple semiconductor die, as described below.

Figure 8B:
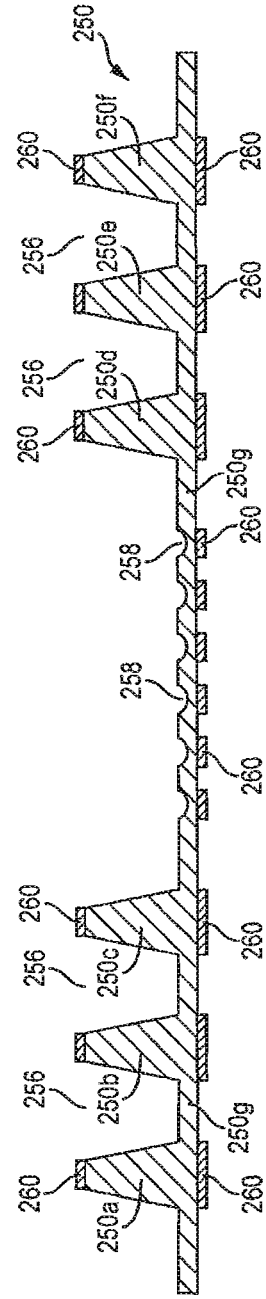

FIG. 8b shows a portion of base substrate 250 associated with one semiconductor die. Base substrate 250 extends beyond the dimensions shown in FIG. 8b for additional semiconductor die. Base substrate 250 is stamped or etched partially through surface 252 to form cavities 256. The cavities 256 create multiple rows of base leads or protrusions 250a, 250b, 250c, 250d, 250e, and 250f extending from the remaining base substrate 250g. In particular, the etching process also forms concave crater capture pads 258 in the remaining base substrate 250g.

An electrically conductive layer 260 is formed over base leads 250a-250f and further over surface 254 of base substrate 250 below base leads 250a-250f and concave crater capture pads 258 using patterning and a suitable metal deposition process such as PVD, CVD, sputtering, electrolytic plating, or electroless plating process. In one embodiment, conductive layer 260 is NiPd. Alternatively, conductive layer 260 can be one or more layers of Al, Cu, Sn, Ni, Au, Ag, or other suitable electrically conductive material.

Figure 8C:
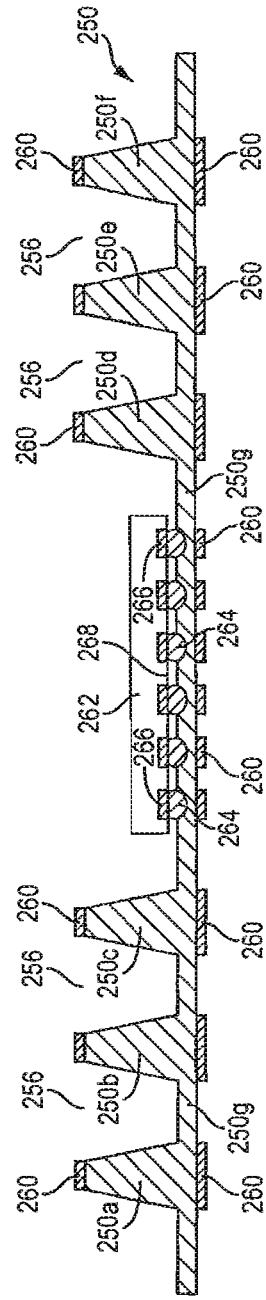

In FIG. 8c, semiconductor die or component 262 is mounted to concave crater capture pads 258 with bumps 264 formed over contact pads 266 on active surface 268. Bumps 264 are disposed in concave crater capture pads 258 for accuracy of alignment of semiconductor die 262. Semiconductor die 262 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 268 to implement analog circuits or digital circuits, such as DSP, ASIC, memory, or other signal processing circuit. Semiconductor die 262 may also contain IPDs, such as inductors, capacitors, and resistors, for RF signal processing. In one embodiment, semiconductor die 262 is a flipchip type semiconductor die. In another embodiment, one or more discrete semiconductor components can be mounted to base leads 250g-250f.

Figure 8D:
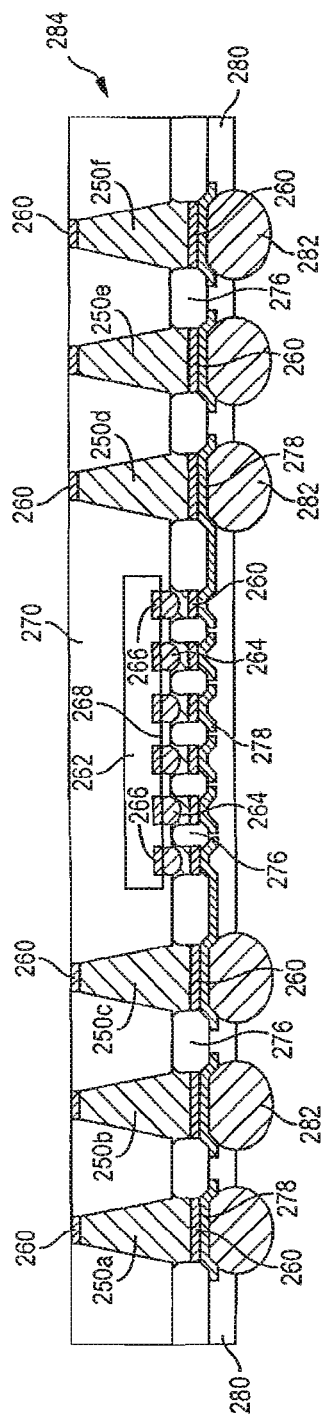

In FIG. 8d, an encapsulant or molding compound 270 is deposited over semiconductor die 262 and base substrate 250, including into cavities 256 and around base leads 250a-250f, using a paste printing, compressive molding, transfer molding, liquid encapsulant molding, vacuum lamination, spin coating, or other suitable applicator. Encapsulant 270 can be polymer composite material, such as epoxy resin with filler, epoxy acrylate with filler, or polymer with proper filler. Encapsulant 270 is non-conductive and environmentally protects the semiconductor device from external elements and contaminants.

In another embodiment, an insulating or passivation layer is formed over semiconductor die 262 and base substrate 250, including into cavities 256 and around base lead 250a-250f, by PVD, CVD, printing, spin coating, spray coating, or thermal oxidation. The insulating layer can be one or more layers of SiO2, Si3N4, SiON, Ta2O5, Al2O3, or other material having similar insulating and structural properties.

Similar to FIG. 3e, a portion of base substrate 250g and encapsulant 270 is removed by an etching process to separate and electrically isolate base leads 250a-250f into multiple rows defined by the post-etching areas of base substrate 250. Base leads 250a-250f and conductive layer 260 remain intact extending through encapsulant 270 following the etching process. Base leads 250a-250f provide vertical electrical connection through encapsulant 270.

Similar to FIG. 3f, an insulating or passivation layer 276 is formed over encapsulant 270, conductive layer 260, and base leads 250a-250f by PVD, CVD, printing, spin coating, spray coating, or thermal oxidation. The insulating layer 276 can be one or more layers of SiO2, Si3N4, SiON, Ta2O5, Al2O3, or other material having similar insulating and structural properties. A portion of insulating layer 276 is removed by an etching process to expose conductive layer 260.

An electrically conductive layer 278 is formed over conductive layer 260 and insulating layer 276 using patterning and a suitable metal deposition process, such as PVD, CVD, sputtering, electrolytic plating, or electroless plating process. Conductive layer 278 can be one or more layers of Al, Cu, Sn, Ni, Au, Ag, or other suitable electrically conductive material. Conductive layer 278 is electrically connected to conductive layer 260 and base leads 250a-250f and operates as a RDL to extend the electrical connectivity for the base leads.

Similar to FIG. 3g, an insulating or passivation layer 280 is formed over insulating layer 276 and conductive layer 278 by PVD, CVD, printing, spin coating, spray coating, or thermal oxidation. The insulating layer 280 can be one or more layers of SiO2, Si3N4, SiON, Ta2O5, Al2O3, or other material having similar insulating and structural properties. A portion of insulating layer 280 is removed by an etching process to expose conductive layer 278.

An electrically conductive bump material is deposited over the exposed conductive layer 278 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 278 using a suitable attachment or bonding process. In one embodiment, the bump material is reflowed by heating the material above its melting point to form spherical balls or bumps 282. In some applications, bumps 282 are reflowed a second time to improve electrical contact to conductive layer 278. The bumps can also be compression bonded to conductive layer 278. Bumps 282 represent one type of interconnect structure that can be formed over conductive layer 278. The interconnect structure can also use bond wires, conductive paste, stud bump, micro bump, or other electrical interconnect.

The wafer-level base substrate 250 is singulated to separate semiconductor die 262 and provide individual eWLB, WLCSP, and QFN semiconductor packages for further integration. FIG. 8d shows one such semiconductor package 284. Semiconductor die 262 is electrically connected to base leads 250a-250f, conductive layers 260 and 278, and bumps 282. The insulating layers 276 and 280, conductive layer 278, and bumps 282 constitute an interconnect structure formed over encapsulant 270 and base leads 250a-250f. The multiple rows of different height base leads 250a-250f formed from base substrate 250 simplifies and expands the vertical interconnection and integration for stacking semiconductor devices in a cost effective manner.

Figure 9A:
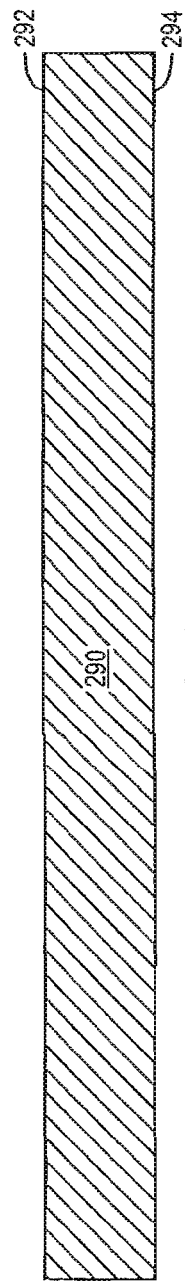
FIGS. 9a-9d illustrate the wafer-level multi-row etched leadframe with openings formed in the base substrate designated for the embedded semiconductor die.

FIGS. 9a-9d illustrate the wafer-level multi-row etched leadframe with openings or holes formed in the base substrate designated for the embedded semiconductor die. FIG. 9a shows a wafer-level base substrate or leadframe 290 made with Cu, Al, or other suitable conductive material. Base substrate 290 has surface 292 and opposite surface 294. Wafer-level base substrate 290 has sufficient area to process multiple semiconductor die, as described below.

Figure 9B:
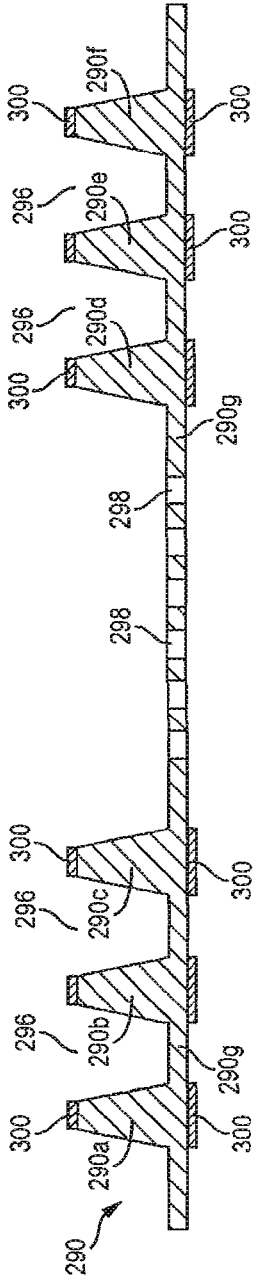

FIG. 9b shows a portion of base substrate 290 associated with one semiconductor die. Base substrate 290 extends beyond the dimensions shown in FIG. 9b for additional semiconductor die. Base substrate 290 is stamped or etched partially through surface 292 to form cavities 296. The cavities 296 create multiple rows of base leads or protrusions 290a, 290b, 290c, 290d, 290e, and 290f extending from the remaining base substrate 290g. In particular, the etching process also forms openings or holes 298 through the remaining base substrate 290g.

An electrically conductive layer 300 is formed over base leads 290a-290f and further over surface 294 of base substrate 290 below base leads 290a-290f using patterning and a suitable metal deposition process such as PVD, CVD, sputtering, electrolytic plating, or electroless plating process. In one embodiment, conductive layer 300 is NiPd. Alternatively, conductive layer 300 can be one or more layers of Al, Cu, Sn, Ni, Au, Ag, or other suitable electrically conductive material.

Figure 9C:
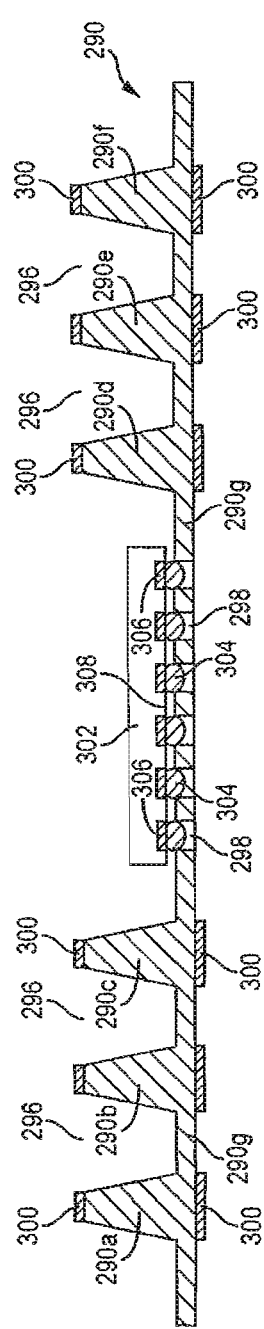

In FIG. 9c, semiconductor die or component 302 is mounted to base substrate 290g with bumps 304 formed over contact pads 306 on active surface 308. In particular, bumps 304 are disposed in openings 298 for accuracy of alignment of semiconductor die 302. Semiconductor die 302 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 308 to implement analog circuits or digital circuits, such as DSP, ASIC, memory, or other signal processing circuit. Semiconductor die 302 may also contain IPDs, such as inductors, capacitors, and resistors, for RF signal processing. In one embodiment, semiconductor die 302 is a flipchip type semiconductor die. In another embodiment, one or more discrete semiconductor components can be mounted to openings 298.

Figure 9D:
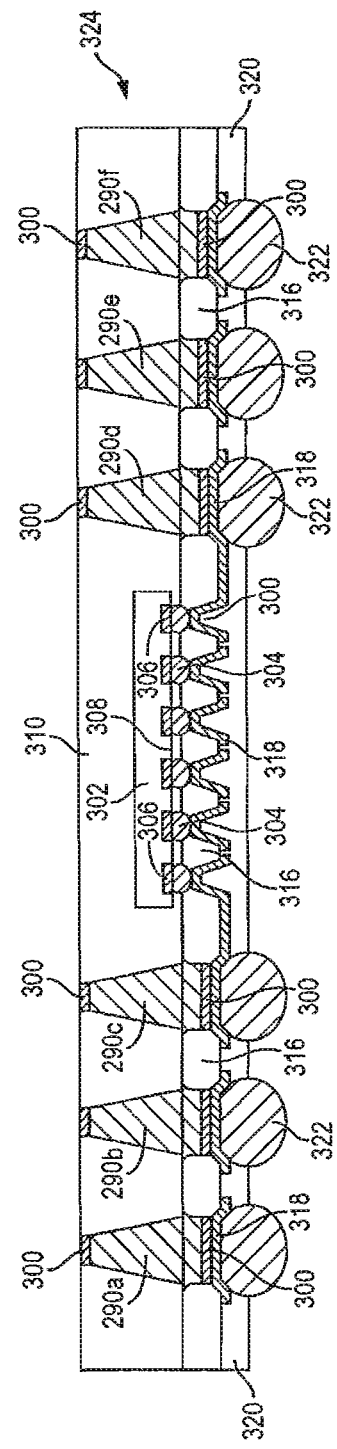

In FIG. 9d, an encapsulant or molding compound 310 is deposited over semiconductor die 302 and base substrate 290, including into cavities 296 and around base leads 290a-290f, using a paste printing, compressive molding, transfer molding, liquid encapsulant molding, vacuum lamination, spin coating, or other suitable applicator. Encapsulant 310 can be polymer composite material, such as epoxy resin with filler, epoxy acrylate with filler, or polymer with proper filler. Encapsulant 310 is non-conductive and environmentally protects the semiconductor device from external elements and contaminants.

In another embodiment, an insulating or passivation layer is formed over semiconductor die 302 and base substrate 290, including into cavities 296 and around base lead 290a-290f, by PVD, CVD, printing, spin coating, spray coating, or thermal oxidation. The insulating layer can be one or more layers of SiO2, Si3N4, SiON, Ta2O5, Al2O3, or other material having similar insulating and structural properties.

Similar to FIG. 3e, a portion of base substrate 290g and encapsulant 310 is removed by an etching process to separate and electrically isolate base leads 290a-290f into multiple rows defined by the post-etching areas of base substrate 290. The portion of substrate base 290g around openings 298 is also removed by the etching process. Base leads 290a-290f and conductive layer 300 remain intact extending completely through encapsulant 310 following the etching process. Base leads 290a-290f provide vertical electrical connection through encapsulant 310.

Similar to FIG. 3f, an insulating or passivation layer 316 is formed over encapsulant 310, conductive layer 300, and base leads 290a-290f by PVD, CVD, printing, spin coating, spray coating, or thermal oxidation. The insulating layer 316 can be one or more layers of SiO2, Si3N4, SiON, Ta2O5, Al2O3, or other material having similar insulating and structural properties. A portion of insulating layer 316 is removed by an etching process to expose conductive layer 300.

An electrically conductive layer 318 is formed over conductive layer 300 and insulating layer 316 using patterning and a suitable metal deposition process, such as PVD, CVD, sputtering, electrolytic plating, or electroless plating process. Conductive layer 318 can be one or more layers of Al, Cu, Sn, Ni, Au, Ag, or other suitable electrically conductive material. Conductive layer 318 is electrically connected to conductive layer 300 and base leads 290a-290f and operates as a RDL to extend the electrical connectivity for the base leads.

Similar to FIG. 3g, an insulating or passivation layer 320 is formed over insulating layer 316 and conductive layer 318 by PVD, CVD, printing, spin coating, spray coating, or thermal oxidation. The insulating layer 320 can be one or more layers of SiO2, Si3N4, SiON, Ta2O5, Al2O3, or other material having similar insulating and structural properties. A portion of insulating layer 320 is removed by an etching process to expose conductive layer 318.

An electrically conductive bump material is deposited over the exposed conductive layer 318 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 318 using a suitable attachment or bonding process. In one embodiment, the bump material is reflowed by heating the material above its melting point to form spherical balls or bumps 322. In some applications, bumps 322 are reflowed a second time to improve electrical contact to conductive layer 318. The bumps can also be compression bonded to conductive layer 318. Bumps 322 represent one type of interconnect structure that can be formed over conductive layer 318. The interconnect structure can also use bond wires, conductive paste, stud bump, micro bump, or other electrical interconnect.

The wafer-level base substrate 290 is singulated to separate semiconductor die 302 and provide individual eWLB, WLCSP, and QFN semiconductor packages for further integration. FIG. 9d shows one such semiconductor package 324. Semiconductor die 302 is electrically connected to base leads 290a-290f, conductive layers 300 and 318, and bumps 322. The insulating layers 316 and 320, conductive layer 318, and bumps 322 constitute an interconnect structure formed over encapsulant 310 and base leads 290a-290f. The multiple rows of different height base leads 290a-290f formed from base substrate 290 simplifies and expands the vertical interconnection and integration for stacking semiconductor devices in a cost effective manner.

Figure 10A:
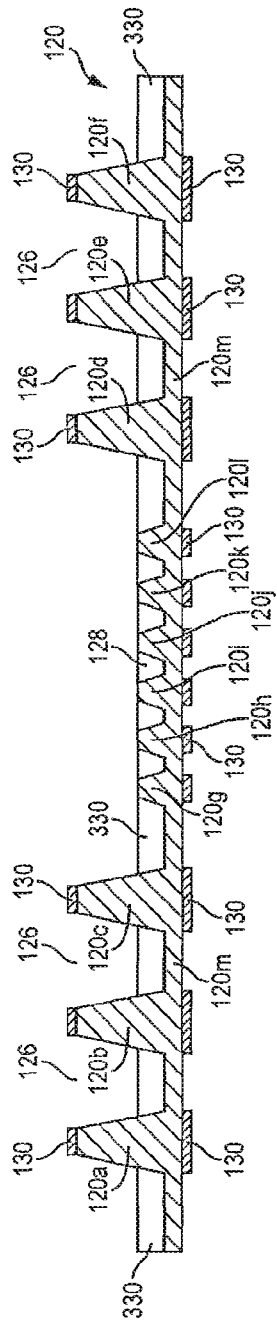
FIGS. 10a-10c illustrate a process of forming a wafer-level multi-row etched leadframe with different height base leads and solder resist layer between the base leads.
Figure 10B:
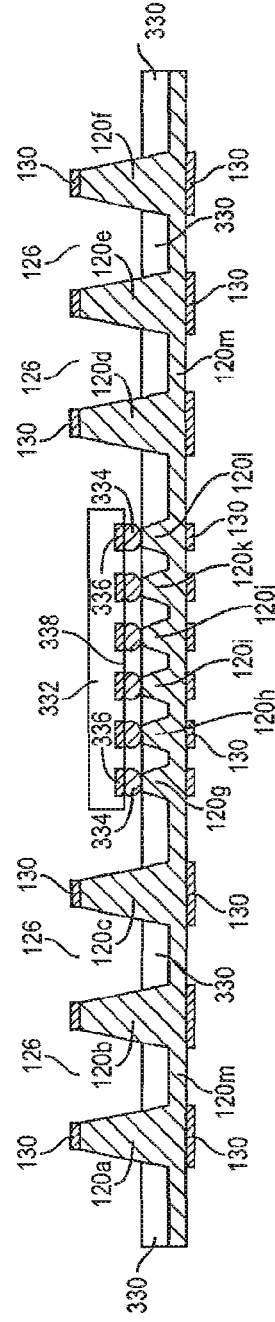
Figure 10C:
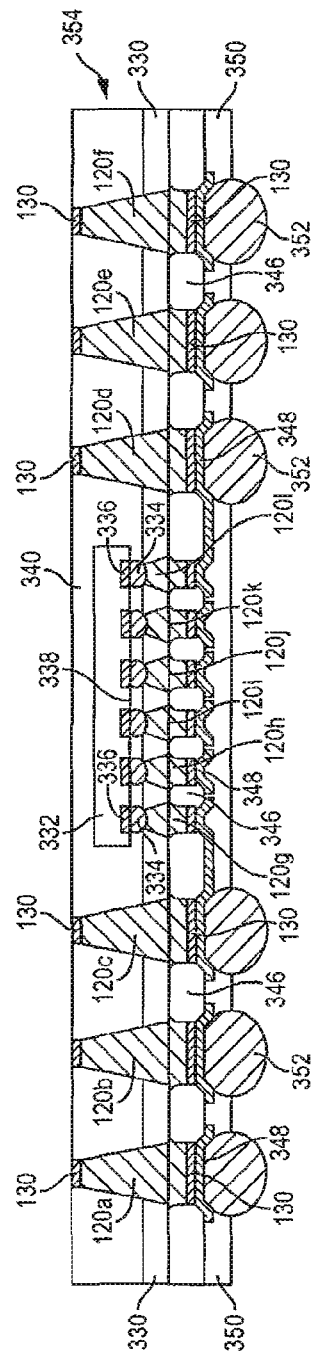

FIGS. 10a-10c show another embodiment of forming a wafer-level multi-row etched leadframe with different height base leads and embedded semiconductor die. Continuing from FIG. 3b, a solder resist layer 330 is formed into a bottom portion of cavities 126 and 128 over the remaining base substrate 120m, as shown in FIG. 10a. In another embodiment, an insulating or passivation layer into a bottom portion of cavities 126 and 128 over the remaining base substrate 120m by PVD, CVD, printing, spin coating, spray coating, or thermal oxidation. The insulating layer can be one or more layers of SiO2, Si3N4, SiON, Ta2O5, Al2O3, or other material having similar insulating and structural properties.

In FIG. 10b, semiconductor die or component 332 is mounted to base lead 120g-120l with bumps 334 formed over contact pads 336 on active surface 338. Semiconductor die 332 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 338 to implement analog circuits or digital circuits, such as DSP, ASIC, memory, or other signal processing circuit. Semiconductor die 332 may also contain IPDs, such as inductors, capacitors, and resistors, for RF signal processing. In one embodiment, semiconductor die 332 is a flipchip type semiconductor die. In another embodiment, one or more discrete semiconductor components can be mounted to base leads 120g-120l.

In FIG. 10c, an encapsulant or molding compound 340 is deposited over semiconductor die 332 and base substrate 120, including into cavities 126 and 128 and around base leads 120a-120l, using a paste printing, compressive molding, transfer molding, liquid encapsulant molding, vacuum lamination, spin coating, or other suitable applicator. Encapsulant 340 can be polymer composite material, such as epoxy resin with filler, epoxy acrylate with filler, or polymer with proper filler. Encapsulant 340 is non-conductive and environmentally protects the semiconductor device from external elements and contaminants.

In another embodiment, an insulating or passivation layer is formed over semiconductor die 332 and base substrate 120, including into cavities 126 and 128 and around base lead 120a-120l, by PVD, CVD, printing, spin coating, spray coating, or thermal oxidation. The insulating layer can be one or more layers of SiO2, Si3N4, SiON, Ta2O5, Al2O3, or other material having similar insulating and structural properties.

Similar to FIG. 3e, a portion of base substrate 120m and encapsulant 340 is removed by an etching process to separate and electrically isolate base leads 120a-120l into multiple rows defined by the post-etching areas of base substrate 120. Base leads 120a-120l and conductive layer 130 remain intact extending partially or completely through encapsulant 340 following the etching process. Base leads 120a-120l provide vertical electrical connection through encapsulant 340.

Similar to FIG. 3f, an insulating or passivation layer 346 is formed over photo resist layer 330, conductive layer 130, and base leads 120a-120l by PVD, CVD, printing, spin coating, spray coating, or thermal oxidation. The insulating layer 346 can be one or more layers of SiO2, Si3N4, SiON, Ta2O5, Al2O3, or other material having similar insulating and structural properties. A portion of insulating layer 346 is removed by an etching process to expose conductive layer 130.

An electrically conductive layer 348 is formed over conductive layer 130 and insulating layer 346 using patterning and a suitable metal deposition process, such as PVD, CVD, sputtering, electrolytic plating, or electroless plating process. Conductive layer 348 can be one or more layers of Al, Cu, Sn, Ni, Au, Ag, or other suitable electrically conductive material. Conductive layer 348 is electrically connected to conductive layer 130 and base leads 120a-120l operates as a RDL to extend the electrical connectivity for the base leads.

Similar to FIG. 3g, an insulating or passivation layer 350 is formed over insulating layer 346 and conductive layer 348 by PVD, CVD, printing, spin coating, spray coating, or thermal oxidation. The insulating layer 350 can be one or more layers of SiO2, Si3N4, SiON, Ta2O5, Al2O3, or other material having similar insulating and structural properties. A portion of insulating layer 350 is removed by an etching process to expose conductive layer 348.

An electrically conductive bump material is deposited over the exposed conductive layer 348 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 348 using a suitable attachment or bonding process. In one embodiment, the bump material is reflowed by heating the material above its melting point to form spherical balls or bumps 352. In some applications, bumps 352 are reflowed a second time to improve electrical contact to conductive layer 348. The bumps can also be compression bonded to conductive layer 348. Bumps 352 represent one type of interconnect structure that can be formed over conductive layer 348. The interconnect structure can also use bond wires, conductive paste, stud bump, micro bump, or other electrical interconnect.

The wafer-level base substrate 120 is singulated to separate semiconductor die 332 and provide individual eWLB, WLCSP, and QFN semiconductor packages for further integration. FIG. 10c shows one such semiconductor package 354. Semiconductor die 332 is electrically connected to base leads 120a-120l, conductive layers 130 and 348, and bumps 352. The insulating layers 346 and 350, conductive layer 348, and bumps 352 constitute an interconnect structure formed over encapsulant 340 and base leads 120a-120l. The multiple rows of different height base leads 120a-120l formed from base substrate 120 simplifies and expands the vertical interconnection and integration for stacking semiconductor devices in a cost effective manner.

Figure 11F:
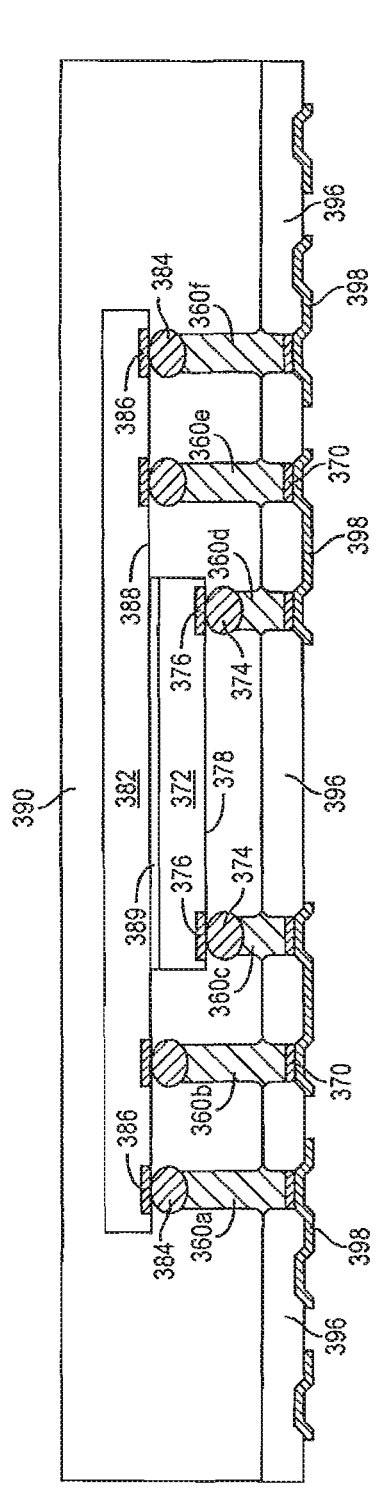

FIGS. 11a-11g illustrate another process of forming a wafer-level multi-row etched leadframe with different height base leads and multiple embedded semiconductor die. FIG. 11a shows a wafer-level base substrate or leadframe 360 made with Cu, Al, or other suitable conductive material. Base substrate 360 has surface 362 and opposite surface 364.

Wafer-level base substrate 360 has sufficient area to process multiple semiconductor die, as described below.

FIG. 11b shows a portion of base substrate 360 associated with one semiconductor die. Base substrate 360 extends beyond the dimensions shown in FIG. 11b for additional semiconductor die. Base substrate 360 is stamped or etched partially through surface 362 to form cavities 366 and 368. The cavities 366 and 368 create multiple rows of base leads or protrusions 360a, 360b, 360c, 360d, 360e, and 360f extending from the remaining base substrate 360g. Due to the nature and depth of cavities 366 and 368, base leads 360a-360b and 360e-360f have a different height as base leads 360c-360d.

An electrically conductive layer 370 is formed over surface 364 of base substrate 360 below base leads 360a-360f using patterning and a suitable metal deposition process such as PVD, CVD, sputtering, electrolytic plating, or electroless plating process. In one embodiment, conductive layer 370 is NiPd. Alternatively, conductive layer 370 can be one or more layers of Al, Cu, Sn, Ni, Au, Ag, or other suitable electrically conductive material.

In FIG. 11c, semiconductor die or component 372 is mounted to base lead 360c-360d with bumps 374 formed over contact pads 376 on active surface 378. Semiconductor die or component 382 is mounted to base lead 360a-360b and 360e-360f with bumps 384 formed over contact pads 386 on active surface 388. A b-stage backside coating 389 is formed between semiconductor die 372 and 382. Semiconductor die 372 and 382 each contain analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within the active surface to implement analog circuits or digital circuits, such as DSP, ASIC, memory, or other signal processing circuit. Semiconductor die 372 and 382 may also contain IPDs, such as inductors, capacitors, and resistors, for RF signal processing. In one embodiment, semiconductor die 372 and 382 are flipchip type semiconductor die. In another embodiment, one or more discrete semiconductor components can be mounted to base leads 360a-360f.

In FIG. 11d, an encapsulant or molding compound 390 is deposited over semiconductor die 372 and 382 and base substrate 360, including into cavities 366 and 368 and around base leads 360a-360f, using a paste printing, compressive molding, transfer molding, liquid encapsulant molding, vacuum lamination, spin coating, or other suitable applicator. Encapsulant 390 can be polymer composite material, such as epoxy resin with filler, epoxy acrylate with filler, or polymer with proper filler. Encapsulant 390 is non-conductive and environmentally protects the semiconductor device from external elements and contaminants.

In another embodiment, an insulating or passivation layer is formed over semiconductor die 372 and 382 and base substrate 360, including into cavities 366 and 368 and around base lead 360a-360f, by PVD, CVD, printing, spin coating, spray coating, or thermal oxidation. The insulating layer can be one or more layers of SiO2, Si3N4, SiON, Ta2O5, Al2O3, or other material having similar insulating and structural properties.

In FIG. 11e, a portion of base substrate 360g and encapsulant 390 is removed by an etching process to separate and electrically isolate base leads 360a-360f into multiple rows defined by the post-etching areas of base substrate 360. Base leads 360a-360f and conductive layer 370 remain intact extending partially into surface 392 of encapsulant 390 following the etching process. Base leads 360a-360f provide vertical electrical connection through bumps 374 and 384 to semiconductor die 372 and 382.

In FIG. 11f, an insulating or passivation layer 396 is formed over encapsulant 390, conductive layer 370, and base leads 360a-360f by PVD, CVD, printing, spin coating, spray coating, or thermal oxidation. The insulating layer 396 can be one or more layers of SiO2, Si3N4, SiON, Ta2O5, Al2O3, or other material having similar insulating and structural properties. A portion of insulating layer 396 is removed by an etching process to expose conductive layer 370.

An electrically conductive layer 398 is formed over conductive layer 370 and insulating layer 396 using patterning and a suitable metal deposition process, such as PVD, CVD, sputtering, electrolytic plating, or electroless plating process. Conductive layer 398 can be one or more layers of Al, Cu, Sn, Ni, Au, Ag, or other suitable electrically conductive material. Conductive layer 398 is electrically connected to conductive layer 370 and base leads 360a-36f operates as a RDL to extend the electrical connectivity for the base leads.

Figure 11G:
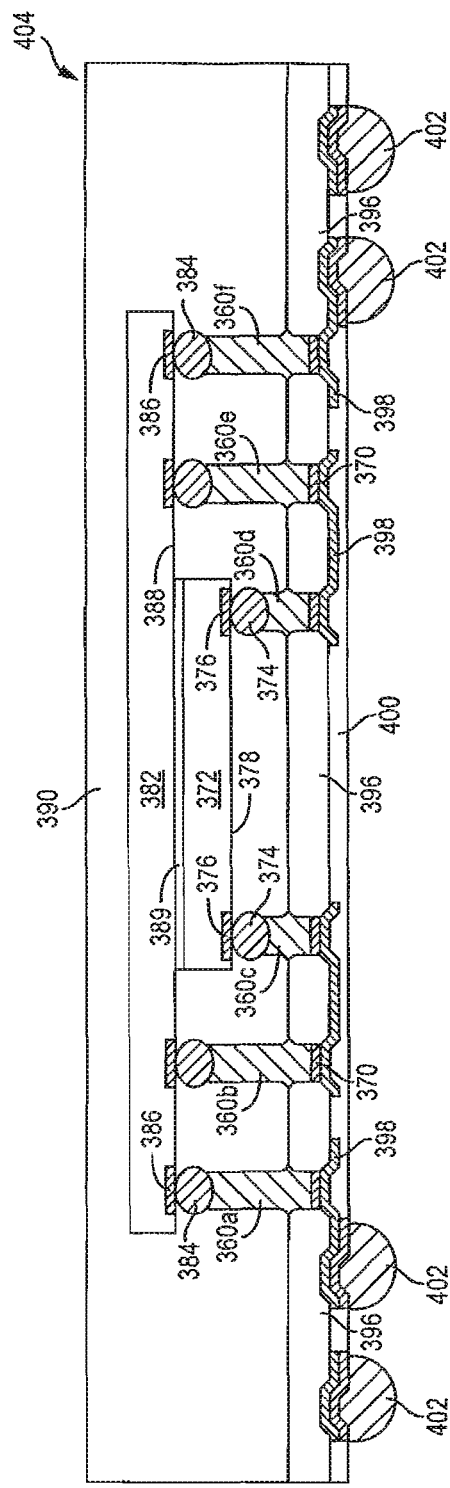

In FIG. 11g, an insulating or passivation layer 400 is formed over insulating layer 396 and conductive layer 398 by PVD, CVD, printing, spin coating, spray coating, or thermal oxidation. The insulating layer 400 can be one or more layers of SiO2, Si3N4, SiON, Ta2O5, Al2O3, or other material having similar insulating and structural properties. A portion of insulating layer 400 is removed by an etching process to expose conductive layer 398.

An electrically conductive bump material is deposited over the exposed conductive layer 398 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 398 using a suitable attachment or bonding process. In one embodiment, the bump material is reflowed by heating the material above its melting point to form spherical balls or bumps 402. In some applications, bumps 402 are reflowed a second time to improve electrical contact to conductive layer 398. The bumps can also be compression bonded to conductive layer 398. Bumps 402 represent one type of interconnect structure that can be formed over conductive layer 398. The interconnect structure can also use bond wires, conductive paste, stud bump, micro bump, or other electrical interconnect.

The wafer-level base substrate 360 is singulated to separate semiconductor die 372 and 382 and provide individual eWLB, WLCSP, and QFN semiconductor packages for further integration. FIG. 11g shows one such semiconductor package 404. Semiconductor die 372 and 382 are electrically connected to base leads 360a-360f, conductive layers 370 and 398, and bumps 402. The insulating layers 396 and 400, conductive layer 398, and bumps 402 constitute an interconnect structure formed over encapsulant 390 and base leads 360a-360f. The multiple rows of different height base leads 360a-360f formed from base substrate 360 simplifies and expands the vertical interconnection and integration for stacking semiconductor devices in a cost effective manner.

Figure 12:
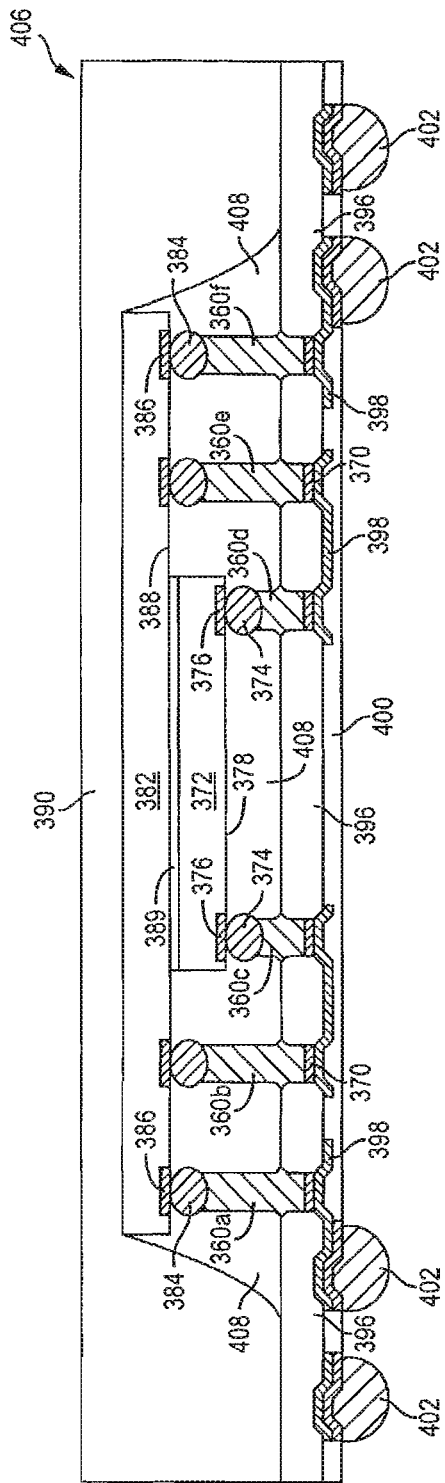
FIG. 12 illustrates stacked semiconductor die with underfill material.

FIG. 12 shows an embodiment of semiconductor package 406, similar to FIG. 11g, with an underfill material 408, such as epoxy resin, deposited under semiconductor die 372 and 382.

Figure 13:
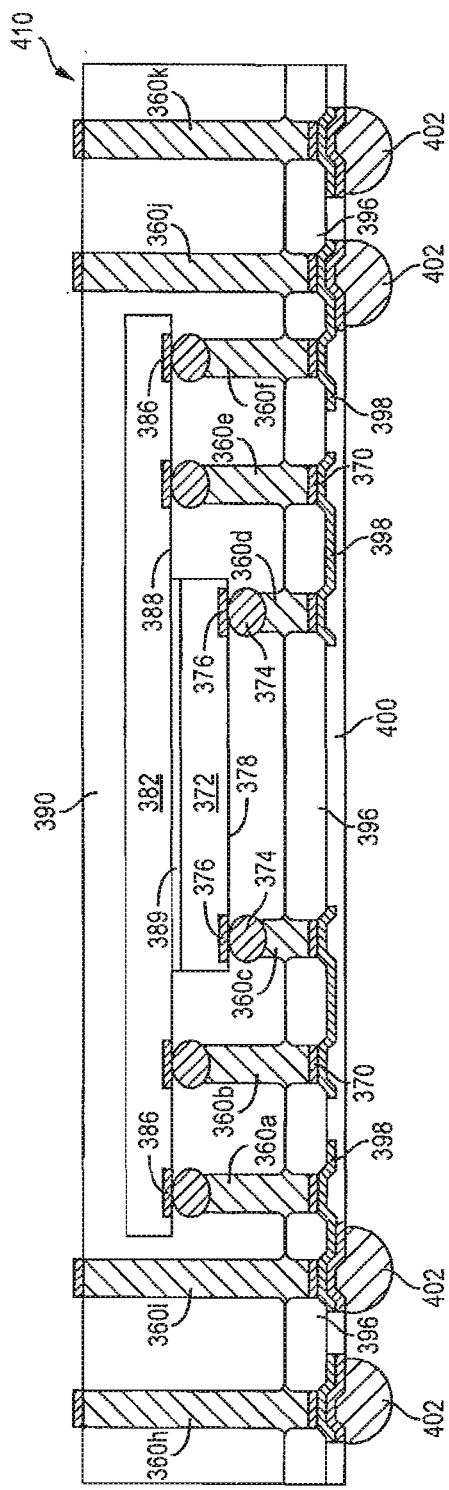
FIG. 13 illustrates the semiconductor package of FIGS. 11a-11g with additional different height base leads wires.

FIG. 13 shows an embodiment of semiconductor package 410, similar to FIG. 11g, with additional base leads 360h-360k formed from base substrate 360 and extending through encapsulant 390. Conductive layer 370 is also formed over base leads 360h-360k. Base leads 360h-360k are electrically connected to conductive layer 398 and bumps 402. Base leads 360h-360k have a greater height than base leads 360a-360f and provide vertical electrical connection between opposing surfaces of encapsulant 390.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a base substrate;
   removing a first portion of the base substrate to form a plurality of first base leads including a first height and a plurality of second base leads including a second height different from the first height, wherein the first height is greater than the second height;
   providing a first semiconductor die including a plurality of electrical contact pads formed directly on a surface of the first semiconductor die;
   disposing the first semiconductor die on the plurality of second base leads and between the first base leads with the second base leads contacting the electrical contact pads of the first semiconductor die;
   removing a second portion of the base substrate to separate and electrically isolate the first and second base leads; and
   forming an interconnect structure on the first and second base leads opposite the first semiconductor die.

2. The method of claim 1, further including disposing a second semiconductor die over the first base leads.

3. The method of claim 2, further including disposing the second semiconductor die between a plurality of third base leads.

4. The method of claim 1, further including
   disposing a second semiconductor die over the first semiconductor die.

5. The method of claim 1, wherein the first base leads provide a vertical interconnect around the first semiconductor die.

6. The method of claim 1, further including forming a concave capture pad over the second base leads.

7. A method of making a semiconductor device, comprising:
   providing a base substrate including a plurality of first base leads comprising a first height and a plurality of second base leads comprising a second height different from the first height, wherein the first height is greater than the second height;
   providing a first semiconductor die including a plurality of electrical contact pads formed directly on a surface of the first semiconductor die;
   disposing the first semiconductor die on the plurality of second base leads with the second base leads coupled to the electrical contact pads of the first semiconductor die;
   removing a portion of the base substrate to separate and electrically isolate the first and second base leads; and
   forming an interconnect structure on the first and second base leads opposite the first semiconductor die.

8. The method of claim 7, further including disposing the first semiconductor die between a plurality of second base leads.

9. The method of claim 7, further including forming a concave capture pad over the first base leads.

10. The method of claim 7, further including forming an insulating layer over the base substrate.

11. The method of claim 8, further including:
    disposing a second semiconductor die over the first semiconductor die; and
    electrically connecting the second semiconductor die to the second base leads.

12. The method of claim 7, further including
    stacking a plurality of the semiconductor devices.

13. A method of making a semiconductor device, comprising:
    providing a base substrate including a plurality of first base leads including a first height and a plurality of second base leads including a second height different from the first height, wherein the first height is greater than the second height;
    providing a first semiconductor die including a plurality of electrical contact pads formed directly on a surface of the first semiconductor die;
    disposing the first semiconductor die on the plurality of second base leads with the second base leads contacting the electrical contact pads of the first semiconductor die; and
    removing a portion of the base substrate to separate and electrically isolate the first and second base leads.

14. The method of claim 13, further including disposing the first semiconductor die between the first base leads.

15. The method of claim 13, further including forming a concave capture pad over the second base leads.

16. The method of claim 13, further including
    forming an interconnect structure over the first and second base leads opposite
    the first semiconductor die.

17. The method of claim 13, further including
    stacking a plurality of the semiconductor devices.

18. The method of claim 13, further including disposing a second semiconductor die over the first semiconductor die.

19. The method of claim 13, further including disposing a second semiconductor die over the second base leads and between a plurality of third base leads.

20. A method of making a semiconductor device, comprising:
    providing a base substrate including a plurality of first base leads comprising a first height and a plurality of second base leads comprising a second height different from the first height, wherein the first height is greater than the second height;
    providing a first semiconductor die including a plurality of electrical contact pads formed directly on a surface of the first semiconductor die;
    disposing the first semiconductor die on the plurality of second base leads and between the first base leads with the second base leads coupled to the electrical contact pads of the first semiconductor die;
    removing a portion of the base substrate to separate and electrically isolate the first and second base leads; and
    forming an interconnect structure on the second base leads opposite the first semiconductor die.

21. The method of claim 20, further including forming a concave capture pad over the base leads.

22. The method of claim 20, further including disposing a second semiconductor die over the first semiconductor die.

23. The method of claim 20, further including disposing the first semiconductor die over a first set of the base leads and between a second set of the base leads.

* * * * *

UNITED STATES PATENT AND TRADEMARK OFFICE
CERTIFICATE OF CORRECTION

PATENT NO. : 8,993,376 B2  
APPLICATION NO. : 13/284811  
DATED : March 31, 2015  
INVENTOR(S) : Zigmund R. Camacho et al.

Page 1 of 1

It is certified that error appears in the above-identified patent and that said Letters Patent is hereby corrected as shown below:

In the Claims

Column 21, line 63, delete "a plurality of second", and insert --the first--.

Column 21, line 66, delete "first", and insert --second--.

Column 22, line 3, delete "The method of claim 8", and insert --The method of claim 7--.

Column 22, line 7, delete "second", and insert --first--.

Column 22, line 39, delete "over the second", and insert --over the first--.

Column 22, line 60, insert --second-- between "over the" and "base leads".

Column 22, line 63, delete "The method of claim 20", and insert --The method of claim 22--.

Column 22, line 64, delete "first semiconductor die", and insert --second semiconductor die--.

Column 22, line 64, delete "over a first set of the base leads and".

Column 22, line 65, delete "second set of the", and insert --a plurality of third--.

Signed and Sealed this  
Twenty-ninth Day of September, 2015

Michelle K. Lee  
*Director of the United States Patent and Trademark Office*